(12) United States Patent
Rokhlenko et al.

(10) Patent No.: US 12,287,574 B2
(45) Date of Patent: Apr. 29, 2025

(54) RESIN COMPOSITION AND FLOW CELLS INCORPORATING THE SAME

(71) Applicant: ILLUMINA, INC., San Diego, CA (US)

(72) Inventors: Yekaterina Rokhlenko, San Diego, CA (US); Timothy J. Merkel, San Diego, CA (US)

(73) Assignee: Illumina, Inc., San Diego, CA (US)

( * ) Notice: Subject to any disclaimer, the term of this patent is extended or adjusted under 35 U.S.C. 154(b) by 612 days.

(21) Appl. No.: 17/624,216

(22) PCT Filed: Dec. 21, 2020

(86) PCT No.: PCT/US2020/066438
§ 371 (c)(1),
(2) Date: Dec. 30, 2021

(87) PCT Pub. No.: WO2021/133735
PCT Pub. Date: Jul. 1, 2021

(65) Prior Publication Data
US 2022/0404699 A1 Dec. 22, 2022

Related U.S. Application Data

(60) Provisional application No. 62/952,821, filed on Dec. 23, 2019.

(51) Int. Cl.
| | | |
|---|---|---|
| *G09F 7/02* | (2006.01) |
| *G01N 21/05* | (2006.01) |
| *G01N 21/64* | (2006.01) |
| *G03F 7/00* | (2006.01) |
| *G03F 7/004* | (2006.01) |
| *G03F 7/021* | (2006.01) |
| *G03F 7/038* | (2006.01) |
| *G03F 7/075* | (2006.01) |
| *B82Y 40/00* | (2011.01) |

(52) U.S. Cl.
CPC .......... *G03F 7/0217* (2013.01); *G01N 21/05* (2013.01); *G01N 21/6428* (2013.01); *G03F 7/0002* (2013.01); *G03F 7/0045* (2013.01); *G03F 7/038* (2013.01); *G03F 7/0757* (2013.01); *B82Y 40/00* (2013.01)

(58) Field of Classification Search
None
See application file for complete search history.

(56) References Cited

U.S. PATENT DOCUMENTS

| | | | |
|---|---|---|---|
| 7,378,455 B2 | 5/2008 | Lu et al. | |
| 8,944,580 B2 * | 2/2015 | Ikegame | G03F 7/0045 |
| | | | 347/100 |
| 9,061,499 B2 * | 6/2015 | Takahashi | B41J 2/1635 |
| 9,096,712 B2 * | 8/2015 | Qiu | C08G 65/22 |
| 11,884,976 B2 * | 1/2024 | Merkel | C08L 63/00 |
| 2004/0234898 A1 | 11/2004 | Batishko et al. | |
| 2012/0040288 A1* | 2/2012 | Adams | G03F 7/0045 |
| | | | 430/270.1 |
| 2012/0107732 A1 | 5/2012 | Qiu | |
| 2012/0229556 A1* | 9/2012 | Ikegame | C08G 65/105 |
| | | | 347/20 |
| 2012/0288796 A1 | 11/2012 | Katayama et al. | |
| 2012/0306961 A1 | 12/2012 | Takahashi et al. | |
| 2016/0136873 A1 | 5/2016 | Chouiki | |

FOREIGN PATENT DOCUMENTS

| | | | |
|---|---|---|---|
| CN | 101111530 A | 1/2008 | |
| CN | 109844638 A | 6/2019 | |
| EP | 1794655 B1 | 12/2011 | |
| EP | 2530098 A1 | 12/2012 | |
| EP | 2717097 A1 | 4/2014 | |
| EP | 3006484 A1 * | 4/2016 | B33Y 70/00 |

OTHER PUBLICATIONS

Pai, Jeng-Ho, et al., "A Photoresist with Low Fluorescence for Bioanalytical Applications", Anal Chem. Nov. 15, 2007; 79(22): 8774-8780, Nov. 15, 2007.

* cited by examiner

*Primary Examiner* — Sanza L. McClendon
(74) *Attorney, Agent, or Firm* — Dierker & Kavanaugh, P.C.

(57) ABSTRACT

An example resin composition includes an epoxy resin matrix, a first photoacid generator, and a second photoacid generator. The first photoacid generator includes an anion having a molecular weight less than about 250 g/mol. The second photoacid generator includes an anion having a molecular weight greater than about 300 g/mol. In an example, i) a cation of the first photoacid generator has, or ii) a cation of the second photoacid generator has, or iii) the cations of the first and second photoacid generators have a mass attenuation coefficient of at least 0.1 L/(g*cm) at a wavelength of incident light to cure the resin composition.

28 Claims, 10 Drawing Sheets

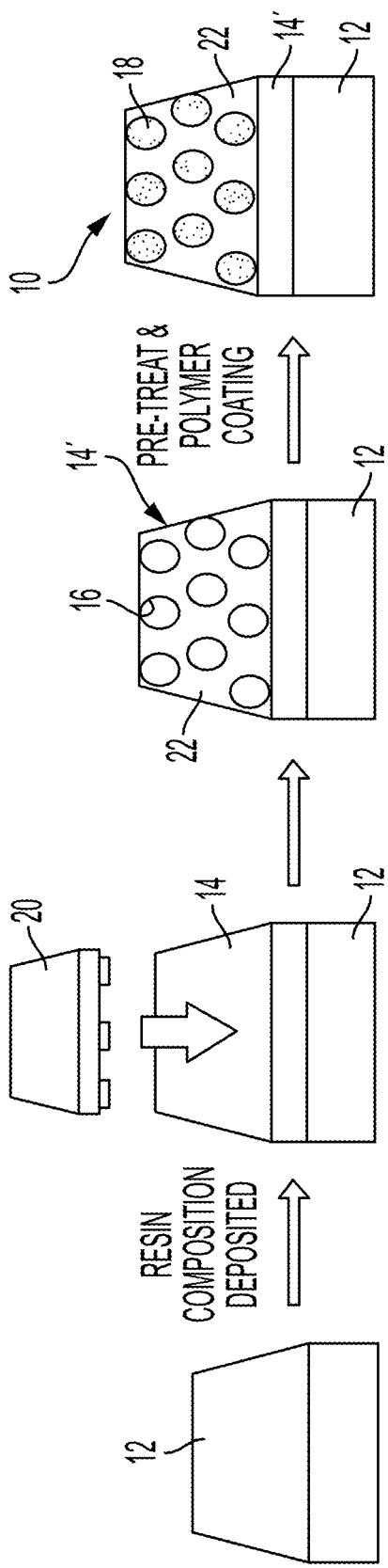

RESIN COMPOSITION AND FLOW CELLS INCORPORATING THE SAME

CROSS-REFERENCE TO RELATED APPLICATION

This application claims the benefit of U.S. Provisional Application Ser. No. 62/952,821, filed Dec. 23, 2019, the contents of which is incorporated by reference herein in its entirety.

BACKGROUND

Nano-imprinting technology enables the economic and effective production of nanostructures. Nano-imprint lithography employs direct mechanical deformation of a resist material by a stamp having nanostructures. The resist material is cured while the stamp is held in place to lock the shape of the nanostructures in the resist material.

Nano-imprint lithography has been used to manufacture patterned substrates, which may be used in a variety of applications. Some patterned substrates include fluidic channels and discrete wells or depressions. These patterned substrates may be built into flow cells. In some flow cells, active surface chemistry is introduced into the discrete depressions, while interstitial regions surrounding the discrete depressions remain inert. These flow cells may be particularly useful for detection and evaluation of a wide range of molecules (e.g., DNA), families of molecules, genetic expression levels, or single nucleotide polymorphisms.

SUMMARY

Examples and aspects of a resin composition are disclosed herein. The resin composition is suitable for use in nano-imprint lithography, and for generating a patterned flow cell surface. The resin composition includes a particular combination of photoacid generators (PAG), that when used together, have a surprising synergistic effect that significantly and desirably alters the extent of cure, e.g., increases resin hardness and/or reduces corrected intensity at 2990 $cm^{-1}$ in a relatively short time period.

In a first aspect, a resin composition comprises an epoxy resin matrix; a first photoacid generator including an anion having a molecular weight less than 250 g/mol; and a second photoacid generator including an anion having a molecular weight greater than about 300 g/mol; wherein i) a cation of the first photoacid generator has, or ii) a cation of the second photoacid generator has, or iii) the cations of the first and second photoacid generators have a mass attenuation coefficient of at least 0.1 L/(g*cm) at a wavelength of incident light to cure the resin composition.

In an example of the first aspect, the epoxy resin matrix comprises an epoxy material selected from the group consisting of an epoxy functionalized silsesquioxane; trimethylolpropane triglycidyl ether; tetrakis(epoxycyclohexyl ethyl)tetramethyl cyclotetrasiloxane; a copolymer of (epoxycyclohexylethyl)methylsiloxane and dimethylsiloxane; 1,3-bis[2-(3,4-epoxycyclohexyl)ethyl]tetramethyl disiloxane; 1,3-bis(glycidoxypropyl) tetramethyl disiloxane; 3,4-epoxycyclohexylmethyl-3,4-epoxycyclo-hexanecarboxylate; bis((3,4-epoxycyclohexyl)methyl) adipate; 4-vinyl-1-cyclohexene 1,2-epoxide; vinylcyclohexene dioxide; 4,5-epoxytetrahydrophthalic acid diglycidylester; 1,2-epoxy-3-phenoxypropane; glycidyl methacrylate; 1,2-epoxyhexadecane; poly(ethylene glycol) diglycidylether; pentaerythritol glycidyl ether; diglycidyl 1,2-cyclohexanedicarboxylate; tetrahydrophthalic acid diglycidyl ester; and combinations thereof.

In an example of the first aspect, the first photoacid generator is selected from the group consisting of bis-(4-methylphenyl) iodonium hexafluorophosphate, triphenylsulfonium hexafluorophosphate, diaryliodonium hexafluorophosphate, and diaryliodonium hexafluoroantimonate.

In an example of the first aspect, the second photoacid generator is selected from the group consisting of triphenylsulfonium tetrakis(perfluorophenyl) borate, tetrakis (pentafluorophenyl) gallate, and tris[(trifluoromethyl) sulfonyl]methanide.

In an example of the first aspect, the cation of the first photoacid generator is, or the cation of the second photoacid generator is, or the cations of the first and second photoacid generators are selected from the group consisting of a diaryliodonium cation having a maximum absorption wavelength ($\lambda_{max}$) of about 350 nm and a triphenylsulfonium cation.

In an example of the first aspect, the cation of the second photoacid generator has the mass attenuation coefficient of at least 0.1 L/(g*cm) at the wavelength of incident light to cure the resin composition; and the cation of the first photoacid generator has a mass attenuation coefficient less than 0.1 L/(g*cm) at the wavelength of incident light to cure the resin composition. In one example, the cation of the second photoacid generator is selected from the group consisting of a diaryliodonium cation having a maximum absorption wavelength ($\lambda_{max}$) of about 350 nm and a triphenylsulfonium cation; and the cation of the first photoacid generator is selected from the group consisting of a bis-(4-methylphenyl) iodonium cation, a (cumene)cyclopentadienyliron (II) cation, a ferrocene cation, a 1-naphthyl diphenyl sulfonium cation, a (4-phenylthiophenyl) diphenylsulfonium, a bis(2,4,6-trimethylphenyl) iodonium cation, a bis(4-tert-butylphenyl) iodonium cation, a N-hydroxy-5-norbornene-2,3-dicarboximide perfluoro-1-butanesulfonate cation, and a triarylsulfonium cation.

In an example of the first aspect, the cation of the first photoacid generator and the cation of the second photoacid generator have respective mass attenuation coefficients of at least 0.1 L/(g*cm) at the wavelength of incident light to cure the resin composition.

In an example of the first aspect, the first photoacid generator is present in an amount ranging from about 1 mass % to about 5 mass % of total solids in the resin composition; and the second photoacid generator is present in an amount ranging from about 0.1 mass % to about 2 mass % of total solids in the resin composition.

In an example of the first aspect, the molecular weight of the anion of the second photoacid generator ranges from greater than about 300 g/mol to about 1,000 g/mol.

It is to be understood that any features of this resin composition disclosed herein may be combined together in any desirable manner and/or configuration to achieve the benefits as described in this disclosure, including, for example, an increased extent of cure.

In a second aspect, a resin composition comprises an epoxy resin matrix including an epoxy functionalized polyhedral oligomeric silsesquioxane; a first photoacid generator including an anion having a molecular weight less than about 250 g/mol; and a second photoacid generator including an anion having a molecular weight ranging from about 300 g/mol to about 1,000 g/mol; wherein i) a cation of the first photoacid generator has, or ii) a cation of the second photoacid generator has, or iii) the cations of the first and second photoacid generators have a mass attenuation coefficient of at least 0.1 L/(g*cm) at the wavelength of incident light to cure the resin composition.

In an example of the second aspect, the epoxy functionalized polyhedral oligomeric silsesquioxane is selected from the group consisting of a glycidyl functionalized polyhedral oligomeric silsesquioxane, an epoxycyclohexyl ethyl functionalized polyhedral oligomeric silsesquioxane, and combinations thereof.

In an example of the second aspect, the epoxy resin matrix further includes an additional epoxy material selected from the group consisting of trimethylolpropane triglycidyl ether; tetrakis(epoxycyclohexyl ethyl)tetramethyl cyclotetrasiloxane; a copolymer of (epoxycyclohexylethyl)methylsiloxane and dimethylsiloxane; 1,3-bis[2-(3,4-epoxycyclohexyl)ethyl]tetramethyl disiloxane; 1,3-bis(glycidoxypropyl) tetramethyl disiloxane; 3,4-epoxycyclohexylmethyl-3,4-epoxycyclohexanecarboxylate; bis((3,4-epoxycyclohexyl)methyl) adipate; 4-vinyl-1-cyclohexene 1,2-epoxide; vinylcyclohexene dioxide; 4,5-epoxytetrahydrophthalic acid diglycidylester; 1,2-epoxy-3-phenoxypropane; glycidyl methacrylate; 1,2-epoxyhexadecane; poly(ethylene glycol) diglycidylether; pentaerythritol glycidyl ether; diglycidyl 1,2-cyclohexanedicarboxylate; tetrahydrophthalic acid diglycidyl ester; and combinations thereof.

In an example of the second aspect, the first photoacid generator is present in an amount ranging from about 1 mass % to about 5 mass % of total solids in the resin composition.

In an example of the second aspect, the second photoacid generator is present in an amount ranging from about 0.1 mass % to about 2 mass % of total solids in the resin composition.

In an example of the second aspect, the first photoacid generator is selected from the group consisting of bis-(4-methylphenyl) iodonium hexafluorophosphate, triphenylsulfonium hexafluorophosphate, diaryliodonium hexafluorophosphate, and diaryliodonium hexafluoroantimonate.

In an example of the second aspect, the second photoacid generator is selected from the group consisting of triphenylsulfonium tetrakis(perfluorophenyl) borate, tetrakis (pentafluorophenyl) gallate, and tris[(trifluoromethyl) sulfonyl]methanide.

In an example of the second aspect, the cation of the first photoacid generator is, or the cation of the second photoacid generator is, or both the cations of the first and second photoacid generators are selected from the group consisting of a diaryliodonium cation having a maximum absorption wavelength (max) of about 350 nm and a triphenylsulfonium cation.

In an example of the second aspect, the cation of the second photoacid generator has the mass attenuation coefficient of at least 0.1 L/(g*cm) at the wavelength of incident light to cure the resin composition; and the cation of the first photoacid generator has a mass attenuation coefficient less than 0.1 L/(g*cm) at the wavelength of incident light to cure the resin composition. In an example, the cation of the second photoacid generator is selected from the group consisting of a diaryliodonium cation having a maximum absorption wavelength ($\lambda_{max}$) of about 350 nm and a triphenylsulfonium cation; and the cation of the first photoacid generator is selected from the group consisting of a bis-(4-methylphenyl) iodonium cation, a (cumene)cyclopentadienyliron (II) cation, a ferrocene cation, a 1-naphthyl diphenyl sulfonium cation, a (4-phenylthiophenyl) diphenylsulfonium, a bis(2,4,6-trimethylphenyl) iodonium cation, a bis(4-tert-butylphenyl) iodonium cation, a N-hydroxy-5-norbornene-2,3-dicarboximide perfluoro-1-butanesulfonate cation, and a triarylsulfonium cation.

In an example of the second aspect, the cation of the first photoacid generator and the cation of the second photoacid generator have respective mass attenuation coefficients of at least 0.1 L/(g*cm) at the wavelength of incident light to cure the resin composition.

It is to be understood that any features of this resin composition disclosed herein may be combined together in any desirable manner. Moreover, it is to be understood that any combination of features of this resin composition and/or of the first aspect of the resin composition may be used together, and/or combined with any of the examples disclosed herein to achieve the benefits as described in this disclosure, including, for example, an increased extent of cure.

In a third aspect, a flow cell comprises a substrate; and a cured, patterned resin on the substrate, the cured, patterned resin including depressions separated by interstitial regions, and the cured, patterned resin including a cured form of a resin composition including: an epoxy resin matrix; a first photoacid generator including an anion having a molecular weight less than about 250 g/mol; and a second photoacid generator including an anion having a molecular weight greater than about 300 g/mol; wherein i) a cation of the first photoacid generator has, or ii) a cation of the second photoacid generator has, or iii) the cations of the first and second photoacid generators have a mass attenuation coefficient of at least 0.1 L/(g*cm) at a wavelength of incident light to cure the resin composition.

An example of the third aspect further comprises a hydrogel in the depressions; and amplification primers attached to the hydrogel.

In an example of the third aspect, the epoxy resin matrix comprises an epoxy material selected from the group consisting of an epoxy functionalized silsesquioxane; trimethylolpropane triglycidyl ether; tetrakis(epoxycyclohexyl ethyl)tetramethyl cyclotetrasiloxane; a copolymer of (epoxycyclohexylethyl)methylsiloxane and dimethylsiloxane; 1,3-bis[2-(3,4-epoxycyclohexyl)ethyl]tetramethyl disiloxane; 1,3-bis(glycidoxypropyl) tetramethyl disiloxane; 3,4-epoxycyclohexylmethyl-3,4-epoxycyclo-hexanecarboxylate; bis((3,4-epoxycyclohexyl)methyl) adipate; 4-vinyl-1-cyclohexene 1,2-epoxide; vinylcyclohexene dioxide; 4,5-epoxytetrahydrophthalic acid diglycidylester; 1,2-epoxy-3-phenoxypropane; glycidyl methacrylate; 1,2-epoxyhexadecane; poly(ethylene glycol) diglycidylether; pentaerythritol glycidyl ether; diglycidyl 1,2-cyclohexanedicarboxylate; tetrahydrophthalic acid diglycidyl ester; and combinations thereof.

In an example of the third aspect, the first photoacid generator is selected from the group consisting of bis-(4-methylphenyl) iodonium hexafluorophosphate, triphenylsulfonium hexafluorophosphate, diaryliodonium hexafluorophosphate, and diaryliodonium hexafluoroantimonate; and the second photoacid generator is selected from the group consisting of triphenylsulfonium tetrakis(perfluorophenyl) borate, tetrakis(pentafluorophenyl) gallate, and tris[(trifluoromethyl) sulfonyl]methanide.

It is to be understood that any features of flow cell disclosed herein may be combined together in any desirable manner. Moreover, it is to be understood that any combination of features of the flow cell and/or of the first aspect of the resin composition and/or of the second aspect of the resin composition may be used together, and/or combined with any of the examples disclosed herein to achieve the benefits as described in this disclosure, including, for example, reduced autofluorescence.

In a fourth aspect, a method comprises depositing a resin composition on a substrate, the resin composition including: an epoxy resin matrix; a first photoacid generator including an anion having a molecular weight less than about 250 g/mol; and a second photoacid generator including an anion having a molecular weight greater than about 300 g/mol; wherein i) a cation of the first photoacid generator has, or ii) a cation of the second photoacid generator has, or iii) the cations of the first and second photoacid generators have a mass attenuation coefficient of at least 0.1 L/(g*cm) at a wavelength of incident light to cure the resin composition; nanoimprinting the deposited resin composition using a working stamp; and exposing the nanoimprinted, deposited resin composition to the incident light at an energy dose ranging from about 0.5 J to about 10 J for 30 seconds or less to form a cured, patterned resin.

It is to be understood that any features of method disclosed herein may be combined together in any desirable manner. Moreover, it is to be understood that any combination of features of the method and/or of the flow cell and/or of the first aspect of the resin composition and/or of the second aspect of the resin composition may be used together, and/or combined with any of the examples disclosed herein to achieve the benefits as described in this disclosure, including, for example, reduced autofluorescence.

In a fifth aspect, a resin composition comprises an epoxy resin matrix; a first photoacid generator including a first anion having a first molecular weight; and a second photoacid generator including a second anion having a second molecular weight that is at least 50 g/mol greater than the first molecular weight; wherein i) a cation of the first photoacid generator has, or ii) a cation of the second photoacid generator has, or iii) the cations of the first and second photoacid generators have a mass attenuation coefficient of at least 0.1 L/(g*cm) at the wavelength of incident light to cure the resin composition.

It is to be understood that any features of this aspect of the resin composition disclosed herein may be combined together in any desirable manner. Moreover, it is to be understood that any combination of features of this aspect of the resin composition and/or of the method and/or of the flow cell and/or of the first aspect of the resin composition and/or of the second aspect of the resin composition may be used together, and/or combined with any of the examples disclosed herein to achieve the benefits as described in this disclosure, including, for example, an increased extent of cure.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIGS. 2A through 2E are schematic perspective views which together depict examples of the method disclosed herein;

DETAILED DESCRIPTION

Figure 1:
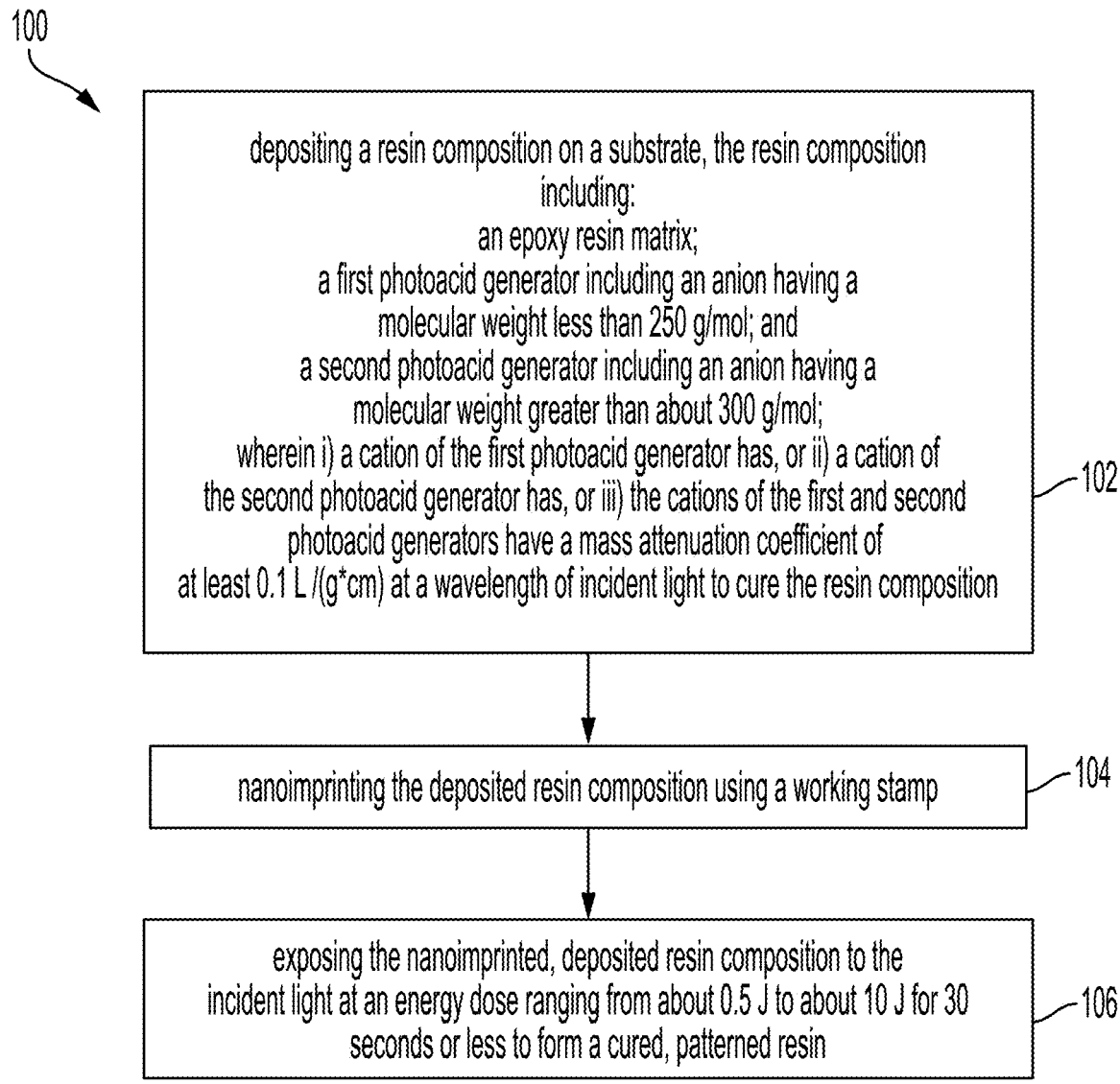
FIG. 1 is a flow diagram illustrating an example of a method disclosed herein.

Some patterned flow cells include a resin material that has discrete wells or depressions formed therein. To form the wells or depressions, the resin material may be imprinted using a variety of techniques, such as nanoimprint lithography. Nanoimprint lithography involves imprinting a resin with a template, and then curing the resin. Any features of the template are transferred to the resin.

Disclosed herein is a resin composition that is suitable for use in nanoimprint lithography, and for generating a patterned flow cell surface. The resin composition includes a particular combination of photoacid generators (PAG). As demonstrated in the example section set forth herein, when the photoacid generators are used together, they have a surprising synergistic effect that significantly and desirably alters the extent of cure, e.g., increases resin hardness and/or reduces corrected intensity at 2990 cm$^{-1}$ in a relatively short time period. Examples of the resin composition disclosed herein exhibit a consistently high extent of cure in under 30 seconds. In some instances, a high extent of cure is achieved in under 5 seconds, which is at least a 90% reduction in cure time compared to other resins that do not include the particular combination of photoacid generators, and that have cure times of 50 seconds, 100 seconds, or more.

The altered extent of cure is coupled with the fact that the desirable properties of the cured resin, such as hardness and low autofluorescence, are not deleteriously affected by the faster curing process.

Resins that are under-cured are not fully vitrified and can exhibit reflow, which may manifest in a poor and uncontrolled well/depression shape in the patterned area. Additionally, under-cured resins may have low hardness values. Low cured resin hardness may increase the material's sensitivity to downstream processing. For example, low hardness can lead to increased scratching during subsequent flow cell manufacturing processes, such as polishing. Because the hardness of examples of the cured resin disclosed herein is within a desirable range (e.g., ranging from about 0.22 GPa to about 0.35 GPa, or from about 0.25 GPa to about 0.3 GPa), the potential for reflow and scratching (or other deleterious downstream processing effects) to occur is minimal or non-existent.

Some cured resins exhibit undesirable levels of autofluorescence at excitation wavelengths of interest (e.g., violet excitation wavelengths ranging from about 380 nm to about 450 nm, or blue excitation wavelengths ranging from about 450 nm to about 495 nm, or green excitation wavelengths ranging from about 495 nm to about 570 nm). Fluorescence from the cured resin can increase the background noise when imaging optical labels of nucleotides that have been incorporated into individual nascent strands formed in the depressions during sequencing. Increased background noise can decrease signal to noise ratios (SNRs) so that signals from individual clusters within individual depressions are more difficult to be resolved during sequencing. The examples of the cured resin composition disclosed herein have minimal absorbance of blue excitation, resulting in relatively low or no blue or longer wavelength autofluorescence when exposed to violet or blue excitation wavelengths. As such, the potential for signal interference during sequencing on a patterned flow cell surface of examples of the cured resin disclosed herein is minimal or non-existent.

As such, the resin composition disclosed herein can have the benefit of significantly increasing the throughput of patterned flow cell manufacturing, without compromising the desired properties of the corresponding cured resin.

Definitions

It is to be understood that terms used herein will take on their ordinary meaning in the relevant art unless specified otherwise. Several terms used herein and their meanings are set forth below.

The singular forms "a", "an", and "the" include plural referents unless the context clearly dictates otherwise.

The terms comprising, including, containing and various forms of these terms are synonymous with each other and are meant to be equally broad.

The terms top, bottom, lower, upper, on, etc. are used herein to describe the flow cell and/or the various components of the flow cell. It is to be understood that these directional terms are not meant to imply a specific orientation, but are used to designate relative orientation between components. The use of directional terms should not be interpreted to limit the examples disclosed herein to any specific orientation(s).

It is to be understood that the ranges provided herein include the stated range and any value or sub-range within the stated range, as if such values or sub-ranges were explicitly recited. For example, a range of about 400 nm to about 1 μm (1000 nm), should be interpreted to include not only the explicitly recited limits of about 400 nm to about 1 μm, but also to include individual values, such as about 708 nm, about 945.5 nm, etc., and sub-ranges, such as from about 425 nm to about 825 nm, from about 550 nm to about 940 nm, etc. Furthermore, when "about" and/or "substantially" are/is utilized to describe a value, they are meant to encompass minor variations (up to +/−10%) from the stated value.

An "acrylamide" is a functional group with the structure

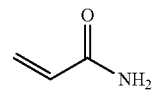

or a monomer including an acrylamide group. An acrylamide may be the chemical compound acrylamide with a substituent in place of one or more hydrogen atoms (e.g., methacrylamide). Examples of the monomer including an acrylamide group include azido acetamido pentyl acrylamide:

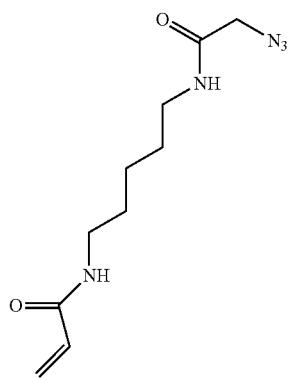 [SMILES: C=CC(=O)NCCCCCNC(=O)CN=[N+]=[N-]]

and N-isopropylacrylamide:

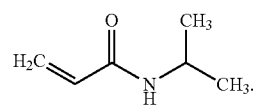

Other acrylamide monomers may be used, some examples of which are set forth herein.

An "aldehyde," as used herein, is an organic compound containing a functional group with the structure-CHO, which includes a carbonyl center (i.e., a carbon double-bonded to oxygen) with the carbon atom also bonded to hydrogen and an R group, such as an alkyl or other side chain. The general structure of an aldehyde is:

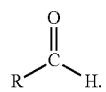

As used herein, "alkyl" refers to a straight or branched hydrocarbon chain that is fully saturated (i.e., contains no double or triple bonds). The alkyl group may have 1 to 20 carbon atoms. Example alkyl groups include methyl, ethyl, propyl, isopropyl, butyl, isobutyl, tertiary butyl, pentyl, hexyl, and the like. As an example, the designation "C1-C4 alkyl" indicates that there are one to four carbon atoms in the alkyl chain, i.e., the alkyl chain is selected from the group consisting of methyl, ethyl, propyl, iso-propyl, n-butyl, isobutyl, sec-butyl, and t-butyl.

As used herein, "alkenyl" refers to a straight or branched hydrocarbon chain containing one or more double bonds. The alkenyl group may have 2 to 20 carbon atoms. Example alkenyl groups include ethenyl, propenyl, butenyl, pentenyl, hexenyl, and the like.

As used herein, "alkyne" or "alkynyl" refers to a straight or branched hydrocarbon chain containing one or more triple bonds. The alkynyl group may have 2 to 20 carbon atoms.

As used herein, "aryl" refers to an aromatic ring or ring system (i.e., two or more fused rings that share two adjacent carbon atoms) containing only carbon in the ring backbone. When the aryl is a ring system, every ring in the system is aromatic. The aryl group may have 6 to 18 carbon atoms. Examples of aryl groups include phenyl, naphthyl, azulenyl, and anthracenyl.

An "amine" or "amino" functional group refers to an $-NR_aR_b$ group, where $R_a$ and $R_b$ are each independently selected from hydrogen (e.g., 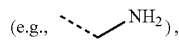), C1-C6 alkyl, C2-C6 alkenyl, C2-C6 alkynyl, C3-C7 carbocycle, C6-C10 aryl, 5-10 membered heteroaryl, and 5-10 membered heterocycle, as defined herein.

As used herein, the term "attached" refers to the state of two things being joined, fastened, adhered, connected or bound to each other, either directly or indirectly. For example, a nucleic acid can be attached to a polymer hydrogel by a covalent or non-covalent bond. A covalent bond is characterized by the sharing of pairs of electrons between atoms. A non-covalent bond is a physical bond that does not involve the sharing of pairs of electrons and can include, for example, hydrogen bonds, ionic bonds, van der Waals forces, hydrophilic interactions and hydrophobic interactions.

"Autofluorescence" refers to the emission of light by the cured resin when exposed to blue excitation wavelengths. No autofluorescence means that the level of fluorescence is below a threshold limit of detection. The term "low autofluorescence" refers to the emission level (of the cured resin when exposed to blue excitation wavelengths) being above the threshold limit of detection and being low enough to be considered noise, and the noise being at a level that does not interfere with the identification of cluster signals during sequencing (e.g., the levels of autofluorescence enable signal to noise ratios (SNRs) that are high enough so that signals from individual clusters can be resolved during sequencing).

It is to be understood that the definition of "low" or "low level", in terms of quantifying the autofluorescence (AF), may vary depending upon the tool used to measure the autofluorescence and/or lamps used to provide the excitation radiation. In some examples, a reference may be used to define the relative AF level. As one example, the reference is the AF level of 0.7 mm thick CORNING® EAGLE XG® glass (CEXG), and a "low AF" can be defined relative to the CEXG output with blue laser excitation. The numerical value of this output (in arbitrary units) is relevant in a relative sense, as it may depend on the material being measured, the excitation and emission bands being measured, the intensity of exciting light, etc. As an example, given emission values of about 3500 AU for 0.7 mm CEXG, an approximately 500 nm layer of the cured resin may be considered to have low AF if the total signal from the stack is less than about 10,000 AU (e.g., cured resin contribution is less than 2× the CEXG contribution), or in other examples, less than about 7,000 AU (e.g., cured resin contribution is less than 1× CEXG contribution).

An "azide" or "azido" functional group refers to $-N_3$.

As used herein, "carbocycle" means a non-aromatic cyclic ring or ring system containing only carbon atoms in the ring system backbone. When the carbocycle is a ring system, two or more rings may be joined together in a fused, bridged or spiro-connected fashion. Carbocycles may have any degree of saturation, provided that at least one ring in a ring system is not aromatic. Thus, carbocycles include cycloalkyls, cycloalkenyls, and cycloalkynyls. The carbocycle group may have 3 to 20 carbon atoms. Examples of carbocycle rings include cyclopropyl, cyclobutyl, cyclopentyl, cyclohexyl, cyclohexenyl, 2,3-dihydro-indene, bicyclo[2.2.2]octanyl, adamantyl, and spiro[4.4]nonanyl.

As used herein, "cycloalkenyl" or "cycloalkene" means a carbocycle ring or ring system having at least one double bond, wherein no ring in the ring system is aromatic. Examples include cyclohexenyl or cyclohexene and norbornenyl or norbornene. Also as used herein, "heterocycloalkenyl" or "heterocycloalkene" means a carbocycle ring or ring system with at least one heteroatom in ring backbone, having at least one double bond, wherein no ring in the ring system is aromatic.

As used herein, "cycloalkyl" refers to a completely saturated (no double or triple bonds) mono- or multi-cyclic hydrocarbon ring system. When composed of two or more rings, the rings may be joined together in a fused fashion. Cycloalkyl groups can contain 3 to 10 atoms in the ring(s). In some embodiments, cycloalkyl groups can contain 3 to 8 atoms in the ring(s). A cycloalkyl group may be unsubstituted or substituted. Example cycloalkyl groups include cyclopropyl, cyclobutyl, cyclopentyl, cyclohexyl, cycloheptyl, and cyclooctyl.

As used herein, "cycloalkynyl" or "cycloalkyne" means a carbocycle ring or ring system having at least one triple bond, wherein no ring in the ring system is aromatic. An example is cyclooctyne. Another example is bicyclononyne. Also as used herein, "heterocycloalkynyl" or "heterocycloalkyne" means a carbocycle ring or ring system with at least one heteroatom in ring backbone, having at least one triple bond, wherein no ring in the ring system is aromatic.

The term "depositing," as used herein, refers to any suitable application technique, which may be manual or automated, and, in some instances, results in modification of the surface properties. Generally, depositing may be performed using vapor deposition techniques, coating techniques, grafting techniques, or the like. Some specific examples include chemical vapor deposition (CVD), spray coating (e.g., ultrasonic spray coating), spin coating, dunk or dip coating, doctor blade coating, puddle dispensing, flow through coating, aerosol printing, screen printing, microcontact printing, inkjet printing, or the like.

As used herein, the term "depression" or "wells" refers to a discrete concave feature in a patterned resin having a surface opening that is at least partially surrounded by interstitial region(s) of the resin. Depressions can have any of a variety of shapes at their opening in a surface including, as examples, round, elliptical, square, polygonal, star shaped (with any number of vertices), etc. The cross-section of a depression taken orthogonally with the surface can be curved, square, polygonal, hyperbolic, conical, angular, etc. As examples, the depression can be a well or a trench/line/trough. The depression may also have more complex architectures, such as ridges, step features, etc.

The term "each," when used in reference to a collection of items, is intended to identify an individual item in the collection, but does not necessarily refer to every item in the collection. Exceptions can occur if explicit disclosure or context clearly dictates otherwise.

The term "epoxy" as used herein refers to

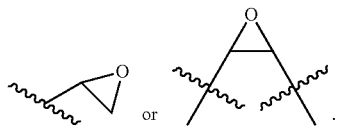

As used herein, the term "flow cell" is intended to mean a vessel having a chamber (e.g., including a flow channel) where a reaction can be carried out, an inlet for delivering reagent(s) to the chamber, and an outlet for removing reagent(s) from the chamber. In some examples, the chamber enables the detection of the reaction that occurs in the chamber. For example, the chamber can include one or more transparent surfaces allowing for the optical detection of arrays, optically labeled molecules, or the like, at the depression(s).

As used herein, a "flow channel" may be an area defined between two bonded or otherwise attached components, which can selectively receive a liquid sample. In some examples, the flow channel may be defined between a patterned resin and a lid or two patterned resins, and thus may be in fluid communication with one or more depressions defined in the patterned resin(s).

As used herein, "heteroaryl" refers to an aromatic ring or ring system (i.e., two or more fused rings that share two adjacent atoms) that contain(s) one or more heteroatoms, that is, an element other than carbon, including but not limited to, nitrogen (N), oxygen (O) and sulfur(S), in the ring backbone. When the heteroaryl is a ring system, every ring in the system is aromatic. The heteroaryl group may have 5-18 ring members.

As used herein, "heterocycle" means a non-aromatic cyclic ring or ring system containing at least one heteroatom in the ring backbone. Heterocycles may be joined together in a fused, bridged or spiro-connected fashion. Heterocycles may have any degree of saturation provided that at least one ring in the ring system is not aromatic. In the ring system, the heteroatom(s) may be present in either a non-aromatic or aromatic ring. The heterocycle group may have 3 to 20 ring members (i.e., the number of atoms making up the ring backbone, including carbon atoms and heteroatoms). In some examples, the heteroatom(s) are O, N, or S.

The term "hydrazine" or "hydrazinyl" as used herein refers to a -NHNH$_2$ group.

As used herein, the term "hydrazone" or "hydrazonyl" as used herein refers to a

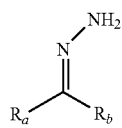

group in which $R_a$ and $R_b$ are each independently selected from hydrogen

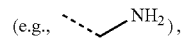

C1-C6 alkyl, C2-C6 alkenyl, C2-C6 alkynyl, C3-C7 carbocycle, C6-C10 aryl, 5-10 membered heteroaryl, and 5-10 membered heterocycle, as defined herein.

As used herein, "hydroxy" or "hydroxyl" refers to an —OH group.

As used herein, the term "interstitial region" refers to an area on a surface (e.g., of a patterned resin) that separates depressions. For example, an interstitial region can separate one feature of an array from another feature of the array. The two features that are separated from each other can be discrete, i.e., lacking physical contact with each other. In another example, an interstitial region can separate a first portion of a feature from a second portion of a feature. In many examples, the interstitial region is continuous whereas the features are discrete, for example, as is the case for a plurality of wells defined in an otherwise continuous surface. In other examples, the interstitial regions and the features are discrete, for example, as is the case for a plurality of trenches separated by respective interstitial regions. The separation provided by an interstitial region can be partial or full separation. Interstitial regions may have a surface material that differs from the surface material of the features defined in the surface. For example, features of an array can have an amount or concentration of a polymer coating and primer(s) that exceeds the amount or concentration present at the interstitial regions. In some examples, the polymer coating and primer(s) may not be present at the interstitial regions.

"Nitrile oxide," as used herein, means a "$R_aC\equiv N^+O^-$" group in which $R_a$ is defined herein. Examples of preparing nitrile oxide include in situ generation from aldoximes by treatment with chloramide-T or through action of base on imidoyl chlorides[RC(Cl)=NOH] or from the reaction between hydroxylamine and an aldehyde.

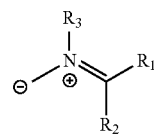

"Nitrone," as used herein, means a group in which $R_1$, $R_2$, and $R_3$ may be any of the $R_a$ and $R_b$ groups defined herein.

As used herein, a "nucleotide" includes a nitrogen containing heterocyclic base, a sugar, and one or more phosphate groups. Nucleotides are monomeric units of a nucleic acid sequence. In RNA, the sugar is a ribose, and in DNA, the sugar is a deoxyribose, i.e. a sugar lacking a hydroxyl group that is present at the 2' position in ribose. The nitrogen containing heterocyclic base (i.e., nucleobase) can be a purine base or a pyrimidine base. Purine bases include adenine (A) and guanine (G), and modified derivatives or analogs thereof. Pyrimidine bases include cytosine (C), thymine (T), and uracil (U), and modified derivatives or analogs thereof. The C-1 atom of deoxyribose is bonded to N-1 of a pyrimidine or N-9 of a purine. A nucleic acid analog may have any of the phosphate backbone, the sugar, or the nucleobase altered. Examples of nucleic acid analogs include, for example, universal bases or phosphate-sugar backbone analogs, such as peptide nucleic acid (PNA).

As used herein, a "photoacid generator" (PAG) is a molecule that releases protons upon exposure to radiation. PAGs generally undergo proton photodissociation irreversibly.

As used herein, the "primer" is defined as a single stranded nucleic acid sequence (e.g., single strand DNA). Some primers, which may be referred to as amplification primers, serve as a starting point for template amplification and cluster generation. Other primers, which may be referred to as sequencing primers, serve as a starting point for DNA synthesis. The 5' terminus of the primer may be modified to allow a coupling reaction with a functional group of a polymer coating. The primer length can be any number of bases long and can include a variety of non-natural nucleotides. In an example, the sequencing primer is a short strand, ranging from 10 to 60 bases, or from 20 to 40 bases.

A "spacer layer," as used herein refers to a material that bonds two components together. In some examples, the spacer layer can be a radiation-absorbing material that aids in bonding, or can be put into contact with a radiation-absorbing material that aids in bonding. The spacer layer may be present in a bonding region, e.g., an area on a substrate that is to be bonded to another material, which may be, as examples, a spacer layer, a lid, another substrate, etc., or combinations thereof (e.g., the spacer layer and a lid). The bond that is formed at the bonding region may be a chemical bond (as described above), or a mechanical bond (e.g., using a fastener, etc.).

A "thiol" functional group refers to —SH.

As used herein, the terms "tetrazine" and "tetrazinyl" refer to six-membered heteroaryl group comprising four nitrogen atoms. Tetrazine can be optionally substituted.

"Tetrazole," as used herein, refer to five-membered heterocyclic group including four nitrogen atoms. Tetrazole can be optionally substituted.

Resin Compositions

In some examples disclosed herein, the resin composition includes an epoxy resin matrix; a first photoacid generator including an anion having a molecular weight less than about 250 g/mol; and a second photoacid generator including an anion having a molecular weight greater than about 300 g/mol; wherein i) a cation of the first photoacid generator has, or ii) a cation of the second photoacid generator has, or iii) the cations of the first and second photoacid generator have a mass attenuation coefficient of at least 0.1 L/(g*cm) at a wavelength of incident light to cure the resin composition.

In other examples disclosed herein, the resin composition includes an epoxy resin matrix; a first photoacid generator including a first anion having a first molecular weight; and a second photoacid generator including a second anion having a second molecular weight that is at least 50 g/mol (and in some instances at least 90 g/mol) greater than the first molecular weight; wherein i) a cation of the first photoacid generator has, or ii), a cation of the second photoacid generator has, or iii) the cations of the first and second photoacid generator have a mass attenuation coefficient of at least 0.1 L/(g*cm) at a wavelength of incident light to cure the resin composition.

In any of the examples disclosed herein, it may be desirable for the one of the two different anions (e.g., the smaller anion) to diffuse at a faster rate than the other of the two different anions (e.g., the larger anion). In one example,
the larger anion is at least four times (4×) larger by volume than the smaller anion (assuming equal densities).

The epoxy resin matrix includes at least one epoxy material. Any suitable epoxy monomer or cross-linkable epoxy copolymer may be used as the epoxy material. The epoxy material may be selected from the group consisting of:

i) an epoxy functionalized silsesquioxane (described further hereinbelow);

ii) trimethylolpropane triglycidyl ether:

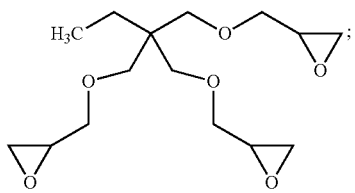 [SMILES: CCC(COCC1CO1)(COCC1CO1)COCC1CO1]

iii) tetrakis(epoxycyclohexyl ethyl)tetramethyl cyclotetrasiloxane:

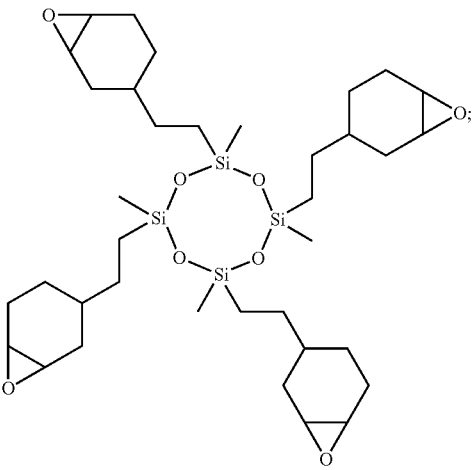 [SMILES: C[Si]1(CCC2CCC3OC3C2)O[Si](C)(CCC2CCC3OC3C2)O[Si](C)(CCC2CCC3OC3C2)O[Si](C)(CCC2CCC3OC3C2)O1]

iv) a copolymer of (epoxycyclohexylethyl)methylsiloxane and dimethylsiloxane:

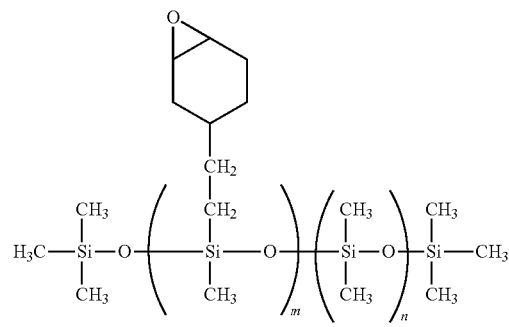

(wherein a ratio of m:n ranges from 8:92 to 10:90);

v) 1,3-bis[2-(3,4-epoxycyclohexyl)ethyl]tetramethyl disiloxane:

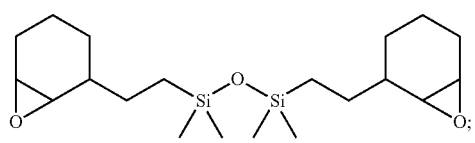 [SMILES: C[Si](C)(CCC1CCCC2OC12)O[Si](C)(C)CCC1CCCC2OC12]

vi) 1,3-bis(glycidoxypropyl) tetramethyl disiloxane:

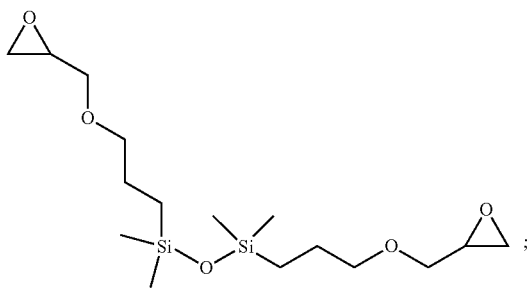 [SMILES: C[Si](C)(CCCOCC1CO1)O[Si](C)(C)CCCOCC1CO1]

vii) 3,4-epoxycyclohexylmethyl-3,4-epoxycyclo-hexan-ecarboxylate:

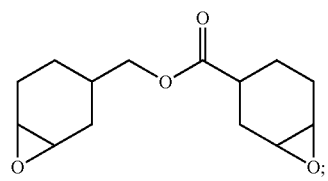 [SMILES: O=C(OCC1CCC2OC2C1)C1CCC2OC2C1]

viii) bis((3,4-epoxycyclohexyl)methyl) adipate:

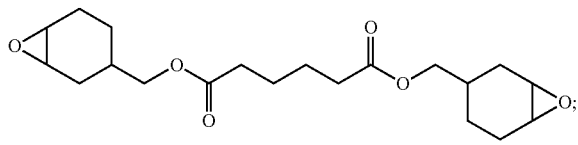 [SMILES: O=C(CCCCC(=O)OCC1CCC2OC2C1)OCC1CCC2OC2C1]

ix) 4-vinyl-1-cyclohexene 1,2-epoxide:

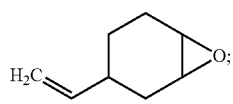

x) vinylcyclohexene dioxide:

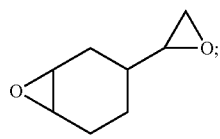

xi) 4,5-epoxytetrahydrophthalic acid diglycidylester:

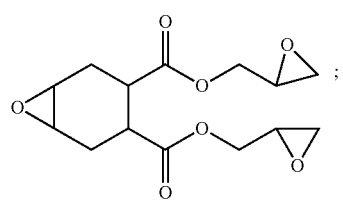 [SMILES: O=C(OCC1CO1)C1CC2OC2CC1C(=O)OCC1CO1]

xii) 1,2-epoxy-3-phenoxypropane:

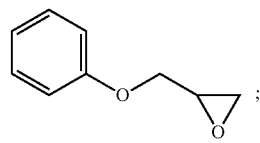 [SMILES: c1ccc(OCC2CO2)cc1]

xiii) glycidyl methacrylate:

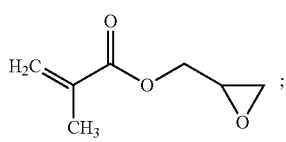

xiv) 1,2-epoxyhexadecane:

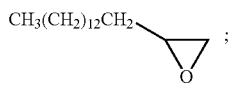

xv) poly(ethylene glycol) diglycidylether:

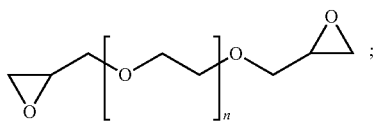

(wherein n ranges from 1 to 100);

xvi) pentaerythritol glycidyl ether:

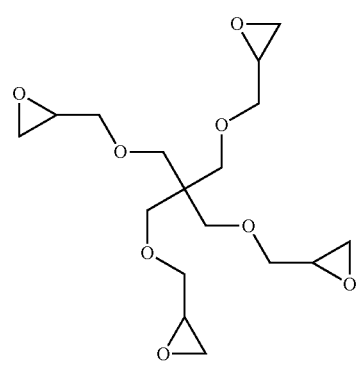 [SMILES: C(OCC(COCC1CO1)(COCC1CO1)COCC1CO1)C1CO1]

xvii) diglycidyl 1,2-cyclohexanedicarboxylate:

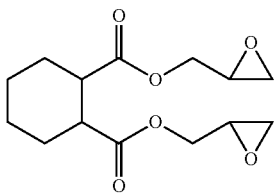 [SMILES: O=C(OCC1CO1)C1CCCCC1C(=O)OCC1CO1]

xviii) tetrahydrophthalic acid diglycidyl ester:

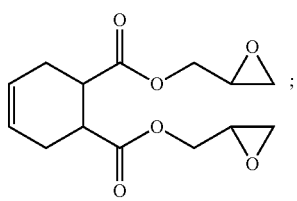 [SMILES: O=C(OCC1CO1)C1CC=CCC1C(=O)OCC1CO1]

and xix) combinations thereof. When combinations are used, it is to be understood that any two or more of the listed epoxy resin materials may be used together in the resin composition.

The epoxy functionalized silsesquioxane includes a silsesquioxane core that is functionalized with epoxy groups.

As used herein, the term "silsesquioxane" refers to a chemical composition that is a hybrid intermediate ($RSiO_{1.5}$) between that of silica ($SiO_2$) and silicone ($R_2SiO$). An example silsesquioxane includes a polyhedral oligomeric silsesquioxane, which is commercially available under the tradename POSS® (Hybrid Plastics). An example of polyhedral oligomeric silsesquioxane can be that described in Kehagias et al., Microelectronic Engineering 86 (2009), pp. 776-778, which is incorporated by reference in its entirety. The composition is an organosilicon compound with the chemical formula $[RSiO_{3/2}]_n$, where the R groups can be the same or different.

Figure 8A:
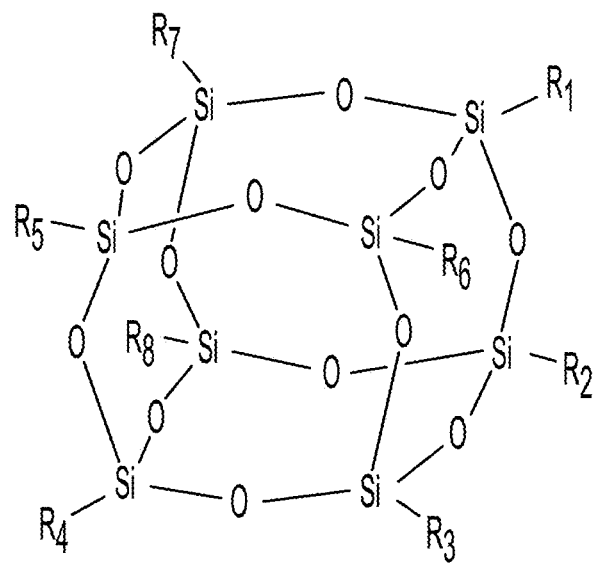
FIG. 8A is an example of a $T_8$ polyhedral structure.
Figure 8B:
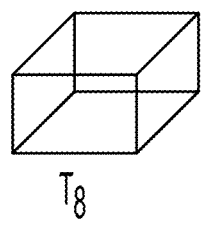
FIG. 8B is a geometric representation of a $T_8$ polyhedral structure.

The resin composition disclosed herein may comprise one or more different cage or core silsesquioxane structures as monomeric units. For example, the polyhedral structure may be a $T_8$ structure (a polyoctahedral cage or core structure), such as that shown in FIG. 8A which is represented by the geometric shape shown in FIG. 8B. This monomeric unit typically has eight arms of functional groups $R_1$ through $R_8$.

Figure 8C:
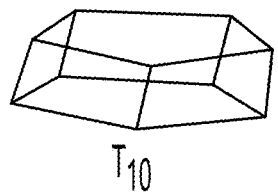
FIG. 8C is a geometric representation of a $T_{10}$ polyhedral structure.
Figure 8D:
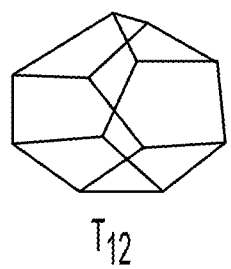
FIG. 8D is a geometric representation of a $T_{12}$ polyhedral structure.

The monomeric unit may have a cage structure with 10 silicon atoms and 10 R groups, referred to as $T_{10}$ and represented by the geometric shape shown in FIG. 8C, or may have a cage structure with 12 silicon atoms and 12 R groups, referred to as $T_{12}$ and represented by the geometric shape shown in FIG. 8D. The silsesquioxane-based material may alternatively include $T_6$, $T_{14}$, or $T_{16}$ cage structures.

The average cage content can be adjusted during the synthesis, and/or controlled by purification methods, and a distribution of cage sizes of the monomeric unit(s) may be used in the examples disclosed herein. As examples, any of the cage structures may be present in an amount ranging from about 30% to about 100% of the total silsesquioxane monomeric units used. Thus, the silsesquioxane-based material may include a mixture of silsesquioxane configurations.

Figure 9A:
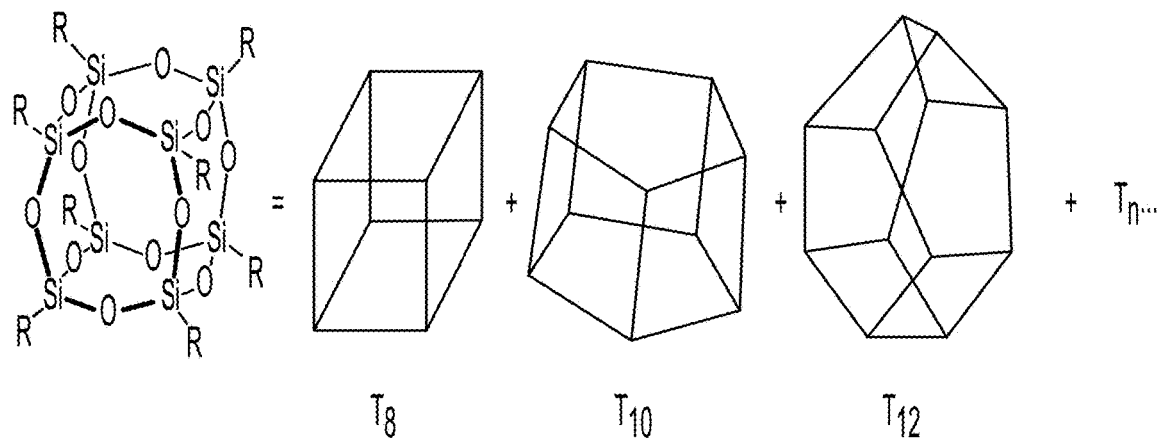
FIG. 9A is a schematic illustration of silsesquioxane materials in the form of various condensed cage structures.
Figure 9B:
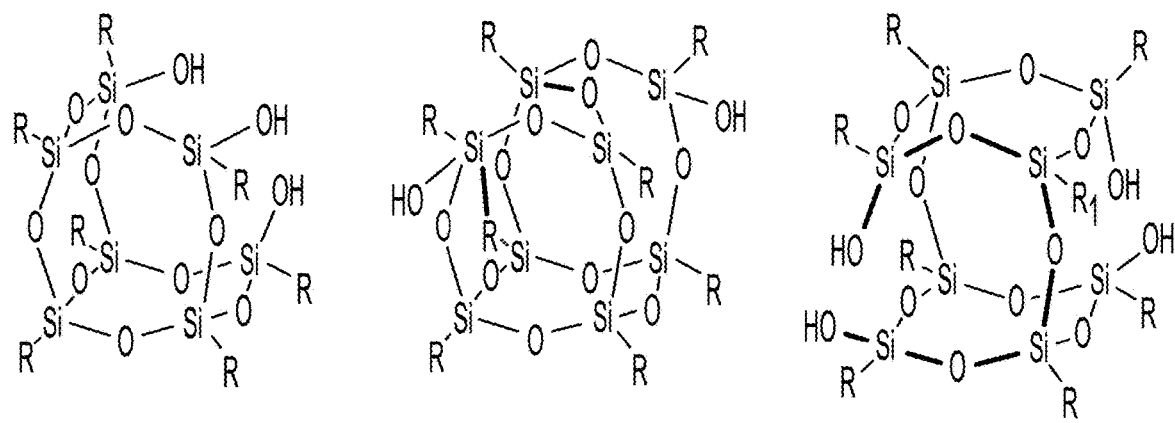
FIG. 9B is a schematic illustration of silsesquioxane materials in the form of various incompletely condensed cage structures.
Figure 9C:
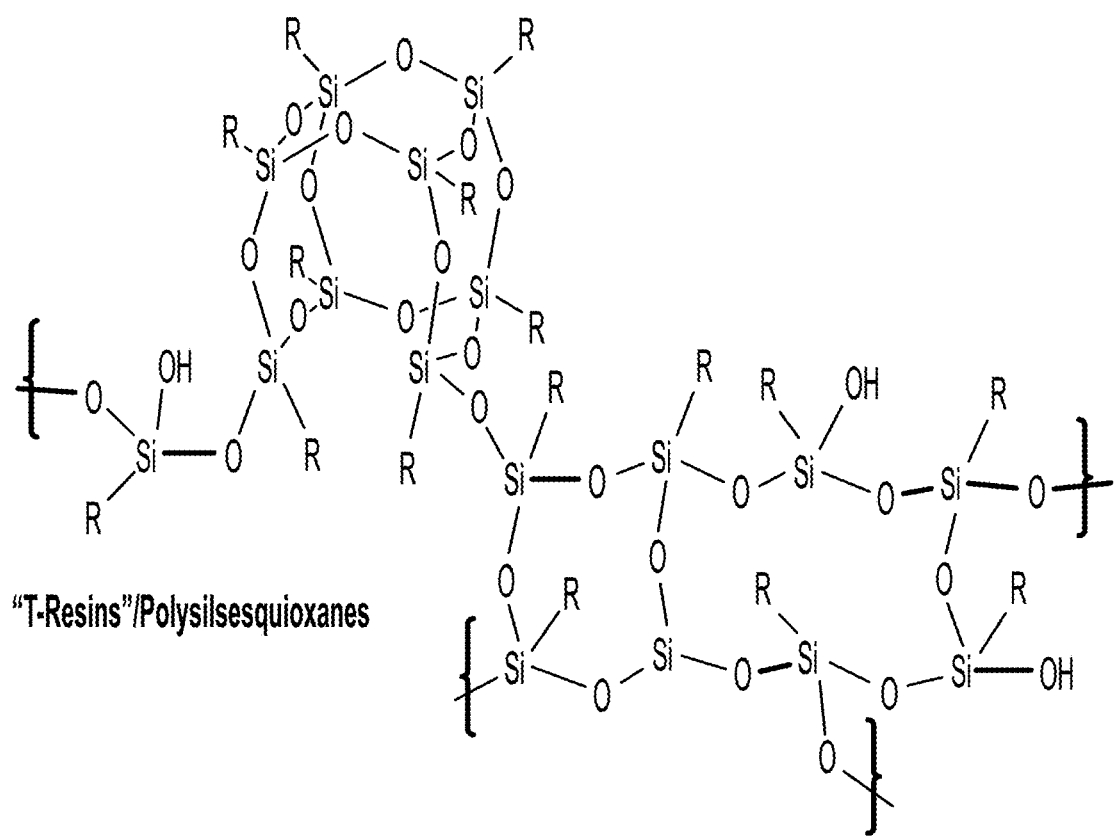
FIG. 9C is a schematic illustration of a silsesquioxane material in the form of a non-cage content large and ill-defined structure.

The silsesquioxane-based material may be a mixture of cage structures, and may include open and partially open cage structures. For example, any epoxy silsesquioxane material described herein may be a mixture of discrete silsesquioxane cages and non-discrete silsesquioxane structures and/or incompletely condensed, discrete structures, such as polymers, ladders, and the like. The partially condensed materials would include epoxy R groups as described herein at some silicon vertices, but some silicon atoms would not be substituted with the epoxy R groups and could be substituted instead with OH groups. In some examples, the silsesquioxane materials comprise a mixture of various forms, such as condensed cages shown in FIG. 9A, incompletely condensed cages shown in FIG. 9B, and/or a non-cage content large and ill-defined structure, as shown in FIG. 9C.

In the examples disclosed herein, at least one of $R_1$ through $R_8$ or $R_{10}$ or $R_{12}$ comprises an epoxy, and thus the silsesquioxane is referred to as an epoxy silsesquioxane (e.g., epoxy polyhedral oligomeric silsesquioxane). In some aspects, the epoxy silsesquioxane comprises terminal epoxy groups. An example of this type of silsesquioxane is glycidyl POSS® having the structure:

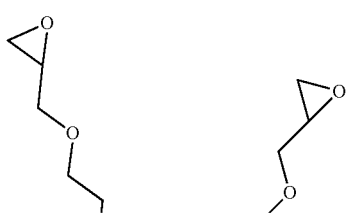

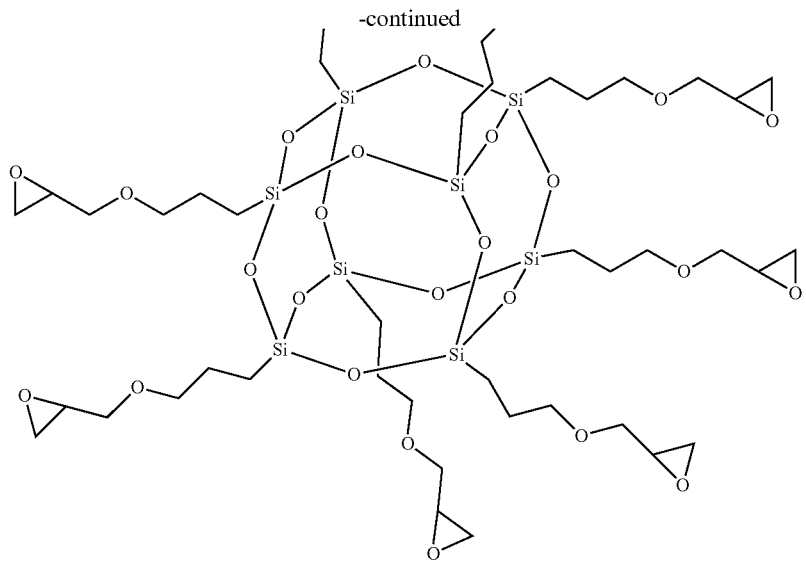

Another example of this type of silsesquioxane is epoxy-cyclohexyl ethyl functionalized POSS® having the structure:

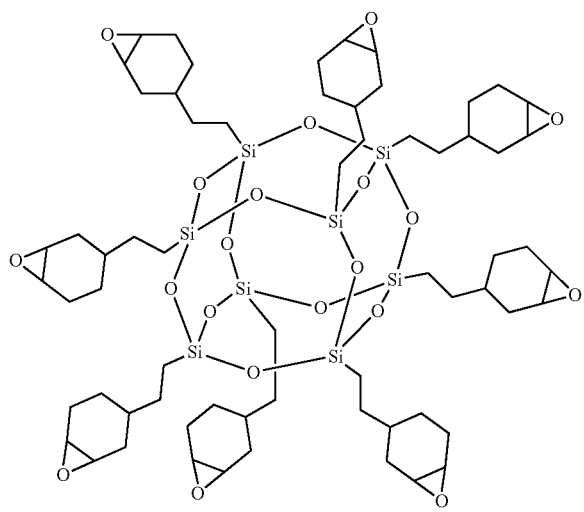 [SMILES: C1CC2OC2CC1CC[Si]12O[Si]3(CCC4CCC5OC5C4)O[Si]4(CCC5CCC6OC6C5)O[Si](CCC5CCC6OC6C5)(O1)O[Si]1(CCC5CCC6OC6C5)O[Si](CCC5CCC6OC6C5)(O2)O[Si](CCC2CCC5OC5C2)(O3)O[Si](CCC2CCC3OC3C2)(O4)O1]

One example of the epoxy resin matrix disclosed herein includes the epoxy functionalized polyhedral oligomeric silsesquioxane, where the epoxy functionalized polyhedral oligomeric silsesquioxane is selected from the group consisting of a glycidyl functionalized polyhedral oligomeric silsesquioxane, an epoxycyclohexyl ethyl functionalized polyhedral oligomeric silsesquioxane, and combinations thereof. This example may include the epoxy silsesquioxane material(s) alone, or in combination with an additional epoxy material selected from the group consisting of trimethylolpropane triglycidyl ether; tetrakis(epoxycyclohexyl ethyl)tetramethyl cyclotetrasiloxane; a copolymer of (epoxycyclohexylethyl)methylsiloxane and dimethylsiloxane; 1,3-bis[2-(3,4-epoxycyclohexyl)ethyl]tetramethyl disiloxane; 1,3-bis(glycidoxypropyl) tetramethyl disiloxane; 3,4-epoxycyclohexylmethyl-3,4-epoxycyclo-hexanecarboxylate; bis((3,4-epoxycyclohexyl)methyl) adipate; 4-vinyl-1-cyclohexene 1,2-epoxide; vinylcyclohexene dioxide; 4,5-epoxytetrahydrophthalic acid diglycidylester; 1,2-epoxy-3-phenoxypropane; glycidyl methacrylate; 1,2-epoxyhexadecane; poly(ethylene glycol) diglycidylether; pentaerythritol glycidyl ether; diglycidyl 1,2-cyclohexanedicarboxylate; tetrahydrophthalic acid diglycidyl ester; and combinations thereof.

In other silsesquioxane examples, a majority of the arms, such as the eight, ten, or twelve arms, or R groups, comprise epoxy groups. In other examples, $R_1$ through $R_8$ or $R_{10}$ or $R_{12}$ are the same, and thus each of $R_1$ through R& or $R_{10}$ or $R_{12}$ comprises an epoxy group. In still other examples, $R_1$ through R& or $R_{10}$ or $R_{12}$ are not the same, and thus at least one of $R_1$ through $R_8$ or $R_{10}$ or $R_{12}$ comprises epoxy and at least one other of $R_1$ through $R_8$ or $R_{10}$ or $R_{12}$ is a non-epoxy functional group, which in some cases is selected from the group consisting of an azide/azido, a thiol, a poly(ethylene glycol), a norbornene, and a tetrazine, or further, for example, alkyl, aryl, alkoxy, and haloalkyl groups. In some aspects, the non-epoxy functional group is selected to increase the surface energy of the resin. In these other examples, the ratio of epoxy groups to non-epoxy groups ranges from 7:1 to 1:7, or 9:1 to 1:9, or 11:1 to 1:11.

In the examples disclosed herein, the epoxy silsesquioxane may also be a modified epoxy silsesquioxane, that includes a controlled radical polymerization (CRP) agent and/or another functional group of interest incorporated into the resin or core or cage structure as one or more of the functional group $R_1$ through $R_a$ or $R_{10}$ or $R_{12}$.

Whether a single epoxy material or a combination of epoxy materials is used in the epoxy resin matrix, the total amount of the epoxy resin matrix in the resin composition ranges from about 93 mass % to about 99 mass % of the total solids.

With any of the example epoxy materials disclosed herein, it is to be understood that the epoxy group(s) allow the monomeric units and/or the copolymer to polymerize and/or cross-link into a cross-linked matrix upon initiation using ultraviolet (UV) light and acid(s) (generated by the combination of photoacid generators).

The examples of the resin composition also include the combination of photoacid generators. In some examples of this combination, the first photoacid generator includes a cation and a small anion, i.e., an anion having a molecule weight less than about 250 g/mol; and the second photoacid generator includes a cation and a large anion, e.g., an anion having a molecule weight greater than about 300 g/mol, such as, for example, ranging from about 300 g/mol to about 1,000 g/mol. In other examples of this combination, the first photoacid generator includes a cation and a small anion having a first molecule weight; and the second photoacid generator includes a cation and a large anion having a molecule weight that is at least 50 g/mol greater than the first molecular weight.

At least one of the cations of the photoacid generators in the resin composition should exhibit strong absorption of the incident light (e.g., ultraviolet (UV) light) that is to be used to cure the resin composition. Sources of high power UV light, such as medium pressure mercury (MPM) lamps and UV light emitting diodes (LED), may emit or be filtered to limit exposure to UV energy within a narrow range of wavelengths that are centered at a particular wavelength. The light at the center wavelength is referred to herein as the incident light. In some examples, the particular wavelength (the incident light) is about 365 nm.

By "strong absorption," "strongly absorb," and "strongly absorbing" it is meant that the cation of the first and/or second photoinitiator has its maximum absorption ($\lambda_{max}$) within +/−40 nm of the wavelength of the incident light that is to be used to cure the resin composition, and/or that the absorbance of the cation of the first and/or second photoinitiator at the wavelength of incident light that is to be used to cure the resin composition is greater than 10% of its maximum absorption ($\lambda_{max}$), and/or that the cation of the first and/or second photoinitiator exhibits has a mass attenuation coefficient of at least 0.1 L/(g*cm) at the wavelength of incident light to cure the resin composition. In one example, the incident light has a wavelength ranging from about 350 nm to about 380 nm (with a center, e.g., around 365 nm), and the cation of the first photoacid generator or the cation of the second photoacid generator has a mass attenuation coefficient ranging from about 0.9 L/(g*cm) to about 1.1 L/(g*cm) at the wavelength of the incident light.

Examples of cations that can strongly absorb incident light, such as light at about 365 nm, include a triphenylsulfonium cation and a diaryliodonium cation having a maximum absorption wavelength ($\lambda_{max}$) of about 350 nm. The triphenylsulfonium cation may have the structure:

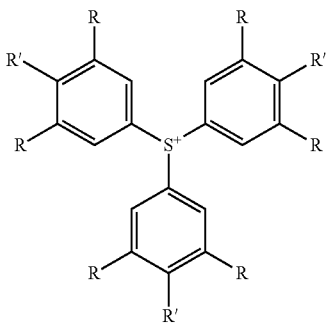

where R is a hydrogen atom and R' is:

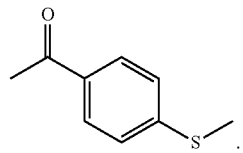

The diaryliodonium cation having a maximum absorption wavelength ($\lambda_{max}$) of about 350 nm may have the structure:

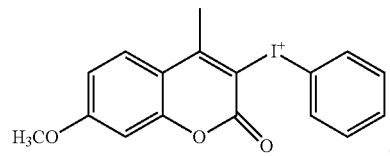

It is desirable for at least one of the cations to exhibit strong absorption of the incident light so that the photoacid generators in the resin composition are efficiently activated upon exposure of the resin to the incident light. When one of the cations absorbs the incident light, the energized cation enables its associated anion to generate acid. The energy absorbing cation may also transfer energy to the anion of the other photoacid generator so that it can generate acid. When both of the cations absorb the incident light, the respective cations enable their associated anions to respectively generate acids. With efficient absorption of light by one or both cations, the photoacid generators can generate desirable levels of their respective acids.

In some examples of the resin composition, the first and second photoacid generators both have the same cation. In these examples, both of the cations exhibit strong absorption of the incident light that is to be used to cure the resin composition. The cation of the first photoacid generator and the cation of the second photoacid generator have respective mass attenuation coefficients of at least 0.1 L/(g*cm) at a wavelength of incident light to cure the resin composition. In these examples, both the cation of the first photoacid generator and the cation of the second photoacid generator may be selected from the group consisting of a diaryliodonium cation having a maximum absorption wavelength ($\lambda_{max}$) of about 350 nm and a triphenylsulfonium cation.

It is to be understood, however, that two strongly absorbing cations may also increase the autofluorescence of the cured resin. As such, in instances where the first and second photoacid generators have the same cation, it may be desirable to use lower amounts of each photoacid generator in order to avoid an increase in autofluorescence. In these examples, the first photoacid generator may be present in the resin composition in an amount ranging from about 1 mass % to about 1.3 mass % of total solids in the resin composition, and the second photoacid generator may be present in the resin composition in an amount ranging from about 0.125 mass % to about 1.3 mass % of total solids in the resin composition.

In other examples of the resin composition, the first and second photoacid generators have different cations. One of the cations may be strongly absorbing of the incident light, while the other of the cations is minimally or non-absorbing of the incident light. An example of a cation that minimally absorbs or does not absorb incident light, such as light at about 365 nm, includes a bis-(4-methylphenyl) iodonium cation, a (cumene)cyclopentadienyliron (II) cation, a ferrocene cation, a 1-naphthyl diphenyl sulfonium cation, a (4-phenylthiophenyl)diphenylsulfonium, a bis(2,4,6-trimethylphenyl) iodonium cation, a bis(4-tert-butylphenyl) iodonium cation, a N-hydroxy-5-norbornene-2,3-dicarboximide perfluoro-1-butanesulfonate cation, and a triarylsulfonium cation.

In some instances, it may be desirable for the second photoacid generator (including the large anion) to include the cation that is strongly absorbing of the incident light. As is described in detail below, the large anion tends to generate a stronger acid, which may increase the polymerization reaction kinetics. As such, in some examples, the cation of the second photoacid generator (having the large anion) has a mass attenuation coefficient of at least 0.1 L/(g*cm) at a wavelength of incident light to cure the resin composition; and the cation of the first photoacid generator (having the small anion) has a mass attenuation coefficient less than 0.1 L/(g*cm) at a wavelength of incident light to cure the resin composition. As one specific example, the cation of the second photoacid generator is selected from the group consisting of a diaryliodonium cation having a maximum absorption wavelength ($\lambda_{max}$) of about 350 nm and a triphenylsulfonium cation; and the cation of the first photoacid generator is selected from the group consisting of a bis-(4-methylphenyl) iodonium cation, a (cumene)cyclopentadienyliron (II) cation, a ferrocene cation, a 1-naphthyl diphenyl sulfonium cation, a (4-phenylthiophenyl) diphenylsulfonium, a bis(2,4,6-trimethylphenyl) iodonium cation, a bis(4-tert-butylphenyl) iodonium cation, a N-hydroxy-5-norbornene-2,3-dicarboximide perfluoro-1-butanesulfonate cation, and a triarylsulfonium cation.

As briefly mentioned herein, when the resin composition is exposed to the incident light, the strongly absorbing cation(s) absorb the incident light, which efficiently activates the large and small anions to generate, respectively, stronger and weaker acids. An acid can abstract an electron pair from the oxygen atom in the epoxy ring of the epoxy material(s) in the epoxy resin matrix. The oxygen atom can propagate the polymerization reaction by attacking the more substituted carbon on a neighboring monomer's epoxy reactive group, thus opening the ring and growing the polymer chain.

The combination of the large and small anions, and their associated stronger and weaker acids, surprisingly can synergistically affect the rate of polymerization. The larger anion generates a stronger acid, which is more reactive and thus increases the propagation rate for each polymer chain. However, the large anion may be diffusion limited by its size. In other words, the large anion may limit the ability of the active polymer chain to find more monomer in order to continue polymerization. The smaller anion generates a weaker acid than the large anion, and thus does not initially increase the propagation rate. However, the smaller anion may be able to diffuse more efficiently through the partially cured resin, which has a higher viscosity and is more constrained than the uncured resin composition. As such, the smaller anion and its weaker acid may continue polymerization after the bulkier large anion and its propagating chain ends are trapped. Therefore, the small anion may promote higher monomer conversion than the large anion. The initial fast kinetics of the large anion combined with the efficient diffusion of the small anion seems to create a surprising and synergistic effect on the extent of cure, without deleteriously affecting the hardness or autofluorescence properties of the cured resin.

The first photoacid generator includes the small anion, which is defined herein as an anion having a molecular weight less than about 250 g/mol. In some examples, the molecular weight of the small anion ranges from about 140 g/mol to about 240 g/mol. Examples of suitable small anions include hexafluoroantimate ($SbF_6^-$), hexafluorophosphate ($PF_6^-$), or hexafluoroarsenate ($AsF_6^-$). Hexafluoroantimate has a molecular weight of about 235 g/mol. Hexafluorophosphate has a molecular weight of about 145 g/mol. Hexafluoroarsenate has a molecular weight of about 188 g/mol.

Some specific examples of the first photoacid generator include bis-(4-methylphenyl) iodonium hexafluorophosphate, triphenylsulfonium hexafluorophosphate (commercially available as OMNICAT® PAG 270 from IGM Resins), diaryliodonium hexafluorophosphate (commercially available as SYLANTO™ 7MP from Sylanto), and diaryliodonium hexafluoroantimonate (commercially available as SYLANTO™ 7 MS from Sylanto).

The first photoacid generator may be included in the resin composition in an amount ranging from about 1 mass % to about 5 mass % of total solids in the resin composition. In another example, the first photoacid generator may be included in an amount ranging from about 2 mass % to about 5 mass % of total solids in the resin composition.

The second photoacid generator includes the large anion, which, in some examples, is defined herein as an anion having a molecular weight greater than about 300 g/mol. In some examples, the molecular weight of the large anion ranges from greater than about 300 g/mol to about 1,000 g/mol. In some examples, the molecular weight of the large anion ranges from about 400 g/mol to about 900 g/mol, or from about 600 g/mol to about 700 g/mol. Examples of suitable large anions include tetrakis(perfluorophenyl) borate ($(C_6F_5)_4B^-$), tetrakis(pentafluorophenyl) gallate ($(C_6F_5)_4Ga^-$), or Tris[(trifluoromethyl) sulfonyl]methanide ($(CF_3SO_2)_2C^-$). Tetrakis(pentafluorophenyl) gallate has a molecular weight of about 740 g/mol. Tris[(trifluoromethyl) sulfonyl]methanide has a molecular weight of about 411 g/mol.

A specific example of the second photoacid generator includes triphenylsulfonium tetrakis(perfluorophenyl) borate. Triphenylsulfonium tetrakis(perfluorophenyl) borate is commercially available under the tradename IRGACURE® PAG 290 (from BASF Corp.).

In other examples, the first and second photoacid generators are selected so that the molecular weight of one of the photoacid generators is at least 50 g/mol greater than the other of the photoacid generators. In this example, any combination of the anions may be used, as long as the difference in their molecular weights is at least 50 g/mol. Thus, in one example, the first photoacid generator may include a hexafluorophosphate anion ($PF_6^-$) (which has a molecular weight of about 145 g/mol) and the second photoacid generator may include a hexafluoroantimate anion ($SbF_6^-$) (which has a molecular weight of about 235 g/mol). In this example, any combination of the cations may be used, as long as one cation has the strong absorption of the incident light.

In any of the examples disclosed herein, the second photoacid generator may be included in the resin composition in an amount ranging from about 0.1 mass % to about 2 mass % of total solids in the resin composition. In another example, the second photoacid generator may be included in an amount ranging from about 0.25 mass % to about 1.5 mass % of total solids in the resin composition.

The resin composition may also include a surface additive. The surface additive can adjust the surface tension of the resin composition, which can improve the detachability of the resin from an imprinting apparatus (e.g., a working stamp), improve the coatability of the resin composition, promote thin film stability, and/or improve leveling. Examples of surface additives include polyacrylate polymers (such as BYK®-350 available from BYK). The amount of the surface additive may be 3 mass % or less.

One specific example of the resin composition includes an epoxy resin matrix; a first photoacid generator including an anion having a molecular weight less than about 250 g/mol; and a second photoacid generator including an anion having a molecular weight greater than about 300 g/mol; wherein i) a cation of the first photoacid generator has, or ii) a cation of the second photoacid generator has, or iii) the cations of the first and second photoacid generators have a mass attenuation coefficient of at least 0.1 L/(g*cm) at a wavelength of incident light to cure the resin composition.

Another specific example of the resin composition includes an epoxy resin matrix including an epoxy functionalized polyhedral oligomeric silsesquioxane; a first photoacid generator including an anion having a molecular weight less than about 250 g/mol; and a second photoacid generator including an anion having a molecular weight ranging from about 300 g/mol to about 1,000 g/mol; wherein i) a cation of the first photoacid generator has, or ii) a cation of the second photoacid generator has, or iii) the cations of the first and second photoacid generators have a mass attenuation coefficient of at least 0.1 L/(g*cm) at a wavelength of incident light to cure the resin composition.

Any example of the resin composition may be made by mixing the epoxy resin matrix component(s) with the first and second photoacid generators. In order to deposit the resin composition, these components (the epoxy resin matrix component(s) and the photoacid generators) may be diluted in a suitable solvent (to achieve a desired viscosity for the deposition technique used), such as propylene glycol monomethyl ether acetate (PGMEA), toluene, dimethyl sulfoxide (DMSO), tetrahydrofuran (THF), etc. In an example, the concentration of the epoxy resin matrix in the solvent ranges from about 15 weight % (wt %) to about 56 wt %, and the concentration of the photoacid generator combination in the solvent ranges from about 0.15 wt % to about 4 wt %. Not to be bound by any particular theory, but it is believed that the upper limits may be higher depending upon the respective solubility of the epoxy resin matrix and the photoacid generators in the solvent that is selected. In an example, the solvent is PGMEA. In the resin composition and solvent solution or mixture, the total concentration (including the epoxy resin matrix, and the photoacid generators) of the resin composition may range from about 15 wt % to about 60 wt %, and the amount of solvent may range from about 40 wt % to about 85 wt %.

Flow Cell and Method

Any example of the resin composition disclosed herein may be used in the formation of the flow cell.

An example of a method 100 for patterning the resin composition to form a surface of a flow cell is shown in FIG. 1. As shown, one example of the method 100 includes depositing a resin composition on a substrate, the resin composition including an epoxy resin matrix, a first photoacid generator including an anion having a molecular weight less than about 250 g/mol, and a second photoacid generator including an anion having a molecular weight greater than about 300 g/mol, wherein i) a cation of the first photoacid generator has, or ii) a cation of the second photoacid generator has, or iii) the cations of the first and second photoacid generator have a mass attenuation coefficient of at least 0.1 L/(g*cm) at a wavelength of incident light to cure the resin composition (reference numeral 102); nanoimprinting the deposited resin composition using a working stamp (reference numeral 104); and exposing the nanoimprinted, deposited resin composition to the incident light at an energy dose ranging from about 0.5 J to about 10 J for 30 seconds or less to form a cured, patterned resin (reference numeral 106).

The resulting flow cell surface includes a substrate and a cured, patterned resin on the substrate, the cured, patterned resin including depressions separated by interstitial regions, and the cured, patterned resin having been formed from an example of the resin composition disclosed herein.

The method 100 is shown schematically in FIG. 2A through FIG. 2C. Some examples of the method 100 further include functionalizing the depressions for a particular application, such as sequencing. An example of the functionalization of the depressions is shown in FIG. 2D and FIG. 2E.

FIG. 2A depicts a substrate 12, and FIG. 2B depicts an example of the resin composition 14 deposited on the substrate 12.

Examples of suitable substrates 12 include epoxy siloxane, glass, modified or functionalized glass, plastics (including acrylics, polystyrene and copolymers of styrene and other materials, polypropylene, polyethylene, polybutylene, polyurethanes, polytetrafluoroethylene (such as TEFLON® from Chemours), cyclic olefins/cyclo-olefin polymers (COP) (such as ZEONOR® from Zeon), polyimides, etc.), nylon (polyamides), ceramics/ceramic oxides, silica, fused silica, or silica-based materials, aluminum silicate, silicon and modified silicon (e.g., boron doped p+ silicon), silicon nitride ($Si_3N_4$), silicon oxide ($SiO_2$), tantalum pentoxide ($Ta_2O_5$) or other tantalum oxide(s) ($TaO_x$), hafnium oxide ($HfO_2$), carbon, metals, inorganic glasses, or the like. The substrate 12 may also be glass or silicon, with a coating layer of tantalum oxide or another ceramic oxide at the surface.

Some examples of the substrate 12 may have a surface-bound epoxy silane attached thereto, which can react with the other resin composition components to form the resin composition 14 (and the cured resin composition 14') on the substrate 12.

In an example, the substrate 12 may have a diameter ranging from about 2 mm to about 300 mm, or a rectangular sheet or panel having its largest dimension up to about 10 feet (~3 meters). In an example, the substrate 12 is a wafer having a diameter ranging from about 200 mm to about 300 mm. In another example, the substrate 12 is a die having a width ranging from about 0.1 mm to about 10 mm. While example dimensions have been provided, it is to be understood that a substrate 12 with any suitable dimensions may be used. For another example, a panel may be used that is a rectangular substrate 12, which has a greater surface area than a 300 mm round wafer.

The resin composition 14 may be any examples of the resin composition described herein, which includes the combination of photoacid generators. The resin composition 14 may be deposited on the substrate 12 using any suitable application technique, which may be manual or automated. As examples, the deposition of the resin composition 14 may be performed using vapor deposition techniques, coating techniques, grafting techniques, or the like. Some specific examples include chemical vapor deposition (CVD), spray coating (e.g., ultrasonic spray coating), spin coating, dunk or dip coating, doctor blade coating, puddle dispensing, aerosol printing, screen printing, microcontact printing, inkjet printing, or the like. In one example, spin coating is used.

The deposited resin composition 14 is then patterned, using any suitable patterning technique. In the example shown in FIG. 2B, nanoimprint lithography is used to pattern the resin composition 14. After the resin composition 14 is deposited, it may be softbaked to remove excess solvent. When performed, the softbake may take place after the resin is deposited and before the working stamp 20 is positioned therein, and at a lower temperature, ranging from about 50° C. to about 150° C., for greater than 0 seconds to about 3 minutes. In an example, the softbake time ranges from about 30 seconds to about 2.5 minutes.

As illustrated in FIG. 2B, a nanoimprint lithography mold or working stamp 20 is pressed against the layer of the resin composition 14 to create an imprint on the resin composition 14. The working stamp 20 includes a template of the desired pattern that is to be transferred to the resin composition 14. In other words, the resin composition 14 is indented or perforated by the protrusions of the working stamp 20. The resin composition 14 may be then be cured with the working stamp 20 in place.

For the resin compositions 14 disclosed herein, curing may be accomplished by exposing the nanoimprinted, deposited resin composition 14 to the incident light at an energy dose ranging from about 0.5 J to about 10 J for 30 seconds or less. The incident light may be actinic radiation, such as ultraviolet (UV) radiation. In one example, the majority of the UV radiation emitted may have a wavelength of about 365 nm.

In the examples disclosed herein, the energy exposure promotes decomposition of the second photoacid generator (including the absorbing cation and the large anion) into a strong acid (a superacid) that initiates polymerization and/or cross-linking of the epoxy resin matrix. The energy exposure also promotes decomposition of the first photoacid generator, either through direct energy absorption by its cation or through indirect energy transfer from the cation of the second photoacid generator, into a weak acid that continues polymerization and/or cross-linking of the epoxy resin matrix. With the effective extent of curing brought on by photoacid generator combination set forth herein, the incident light exposure time may be 30 seconds or less. In some instances, the incident light exposure time may be 10 seconds or less. In still other instances, the incident light exposure time may be about 3 seconds.

The curing process may include a single UV exposure stage. After curing and the release of the working stamp 20, topographic features, e.g., the depressions 16, are defined in the resin composition 14. As shown in FIG. 2C, the resin composition 14 having the depressions 16 defined therein is referred to as the cured, patterned resin 14'. Due, at least in part, to the efficient photopolymerization of the photoacid generator combination disclosed herein, the method disclosed herein does not involve a post UV curing hardbake step in order to attain well-cured films.

The chemical make-up of the cured, patterned resin 14' depends upon the epoxy resin matrix and the photoacid generators used in the resin composition 14.

Figure 2F:
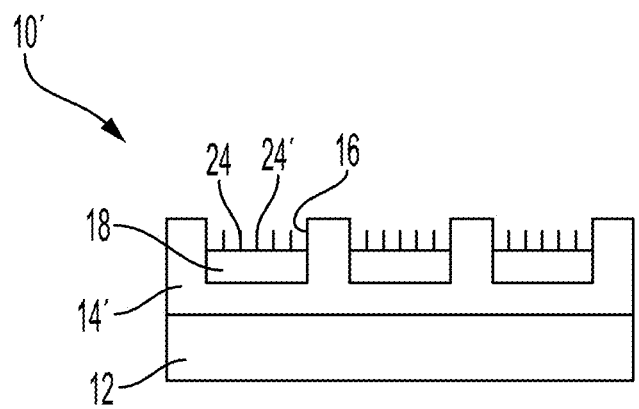
FIG. 2F is a schematic and cross-sectional view taken along line 2F-2F of FIG. 2E.

As shown in FIG. 2C, the cured, patterned resin 14' includes the depressions 16 defined therein, and interstitial regions 22 separating adjacent depressions 16. In the examples disclosed herein, the depressions 16 become functionalized with a polymeric hydrogel 18 (FIG. 2C and FIG. 2D) and primers 24 (FIG. 2E and FIG. 2F), while portions of the interstitial regions 22 may be used for bonding but will not have the polymeric hydrogel 18 or the primer(s) 24 thereon.

Many different layouts of the depressions 16 may be envisaged, including regular, repeating, and non-regular patterns. In an example, the depressions 16 are disposed in a hexagonal grid for close packing and improved density. Other layouts may include, for example, rectilinear (i.e., rectangular) layouts (e.g., lines or trenches), triangular layouts, and so forth. In some examples, the layout or pattern can be an x-y format of depressions 16 that are in rows and columns. In some other examples, the layout or pattern can be a repeating arrangement of depressions 16 and/or interstitial regions 22. In still other examples, the layout or pattern can be a random arrangement of depressions 16 and/or interstitial regions 22. The pattern may include stripes, swirls, lines, triangles, rectangles, circles, arcs, checks, plaids, diagonals, arrows, squares, and/or cross-hatches. In an example, the depressions 16 are wells arranged in rows, as shown in FIG. 2C.

The layout or pattern of the depressions 16 may be characterized with respect to the density of the depressions 16 (i.e., number of depressions 16) in a defined area. For example, the depressions 16 may be present at a density of approximately 2 million per $mm^2$. The density may be tuned to different densities including, for example, a density of at least about 100 per $mm^2$, about 1,000 per $mm^2$, about 0.1 million per $mm^2$, about 1 million per $mm^2$, about 2 million per $mm^2$, about 5 million per $mm^2$, about 10 million per $mm^2$, about 50 million per $mm^2$, or more, or less. It is to be further understood that the density of depressions 16 in the cured, patterned resin 14' can be between one of the lower values and one of the upper values selected from the ranges above. As examples, a high density array may be characterized as having depressions 16 separated by less than about 100 nm, a medium density array may be characterized as having depressions 16 separated by about 400 nm to about 1 µm, and a low density array may be characterized as having depressions 16 separated by greater than about 1 µm. While example densities have been provided, it is to be understood that substrates with any suitable densities may be used.

The layout or pattern of the depressions 16 may also or alternatively be characterized in terms of the average pitch, i.e., the spacing from the center of the depression 16 to the center of an adjacent depression 16 (center-to-center spacing) or from the right edge of one depression 16 to the left edge of an adjacent depression 16 (edge-to-edge spacing). The pattern can be regular, such that the coefficient of variation around the average pitch is small, or the pattern can be non-regular in which case the coefficient of variation can be relatively large. In either case, the average pitch can be, for example, at least about 10 nm, about 50 nm, about 0.1 µm, about 0.5 µm, about 1 µm, about 5 µm, about 10 µm, about 100 µm, or more, or less. The average pitch for a particular pattern of depressions 16 can be between one of the lower values and one of the upper values selected from the ranges above. In an example, the depressions 16 have a pitch (center-to-center spacing) of about 1.5 µm. While example average pitch values have been provided, it is to be understood that other average pitch values may be used.

The size of each depression 16 may be characterized by its volume, opening area, depth, and/or diameter.

Each depression 16 can have any volume that is capable of confining a fluid. The minimum or maximum volume can be selected, for example, to accommodate the throughput (e.g., multiplexity), resolution, nucleotides, or analyte reactivity expected for downstream uses of the flow cell. For example, the volume can be at least about $1 \times 10^{-3}$ µm³, about $1 \times 10^{-2}$ µm³, about 0.1 µm³, about 1 µm³, about 10 µm³, about 100 µm³, or more, or less. It is to be understood that the polymeric hydrogel 18 can fill all or part of the volume of a depression 16.

The area occupied by each depression opening can be selected based upon similar criteria as those set forth above for well volume. For example, the area for each depression opening can be at least about $1 \times 10^{-3}$ µm², about $1 \times 10^{-2}$ µm², about 0.1 µm², about 1 µm², about 10 µm², about 100 µm², or more, or less. The area occupied by each depression opening can be greater than, less than or between the values specified above.

The depth of each depression 16 can be large enough to house some of the polymeric hydrogel 18. In an example, the depth may be about 0.1 µm, about 0.5 µm, about 1 µm, about 10 µm, about 100 µm, or more, or less. In some examples, the depth is about 0.4 µm. The depth of each depression 16 can be greater than, less than or between the values specified above.

In some instances, the diameter or length and width of each depression 16 can be about 50 nm, about 0.1 µm, about 0.5 µm, about 1 µm, about 10 µm, about 100 µm, or more, or less. The diameter or length and width of each depression 16 can be greater than, less than or between the values specified above.

As shown between FIG. 2C and FIG. 2D, after the resin composition 14 is patterned and cured, the cured, patterned resin 14' may be treated to prepare the surface for application of a polymeric hydrogel 18.

In an example, the cured, patterned resin 14' may be exposed to silanization, which attaches a silane or the silane derivative to the cured, patterned resin 14'. Silanization introduces the silane or the silane derivative across the surface, including in the depressions 16 (e.g., on the bottom surface and along the side walls) and on the interstitial regions 22.

Silanization may be accomplished using any silane or silane derivative. The selection of the silane or silane derivative may depend, in part, upon the functionalized molecule that is to be used to form the polymeric hydrogel 18 (shown in FIG. 2D), as it may be desirable to form a covalent bond between the silane or silane derivative and the polymer coating 18. The method used to attach the silane or silane derivative to the cured, patterned resin 14' may vary depending upon the silane or silane derivative that is being used. Several examples are set forth herein.

Examples of suitable silanization methods include vapor deposition (e.g., a YES method), spin coating, or other deposition methods. Some examples of methods and materials that may be used to silanize the cured, patterned resin 14' are described herein, although it is to be understood that other methods and materials may be used.

In an example utilizing the YES CVD oven, the cured, patterned resin 14' on the substrate 12 is placed in the CVD oven. The chamber may be vented and then the silanization cycle started. During cycling, the silane or silane derivative vessel may be maintained at a suitable temperature (e.g., about 120° C. for norbornene silane), the silane or silane derivative vapor lines be maintained at a suitable temperature (e.g., about 125° C. for norbornene silane), and the vacuum lines be maintained at a suitable temperature (e.g., about 145° C.).

In another example, the silane or silane derivative (e.g., liquid norbornene silane) may be deposited inside a glass vial and placed inside a glass vacuum desiccator with a patterned substrate 12. The desiccator can then be evacuated to a pressure ranging from about 15 mTorr to about 30 mTorr, and placed inside an oven at a temperature ranging from about 60° C. to about 125° C. Silanization is allowed to proceed, and then the desiccator is removed from the oven, cooled and vented in air.

Vapor deposition, the YES method and/or the vacuum desiccator may be used with a variety of silane or silane derivatives, such as those silane or silane derivative including a cycloalkene unsaturated moiety, such as norbornene, a norbornene derivative (e.g., a (hetero) norbornene including an oxygen or nitrogen in place of one of the carbon atoms), transcyclooctene, transcyclooctene derivatives, transcyclopentene, transcycloheptene, trans-cyclononene, bicyclo[3.3.1]non-1-ene, bicyclo[4.3.1]dec-1 (9)-ene, bicyclo[4.2.1]non-1 (8)-ene, and bicyclo[4.2.1]non-1-ene. Any of these cycloalkenes can be substituted, for example, with an R group, such as hydrogen, alkyl, alkenyl, alkynyl, cycloalkyl, cycloalkenyl, cycloalkynyl, aryl, heteroaryl, heteroalicycle, aralkyl, or (heteroalicycle) alkyl. An example of the norbornene derivative includes [(5-bicyclo[2.2.1] hept-2-enyl)ethyl] trimethoxysilane. As other examples, these methods may be used when the silane or silane derivative includes a cycloalkyne unsaturated moiety, such as cyclooctyne, a cyclooctyne derivative, or bicyclononynes (e.g., bicyclo[6.1.0]non-4-yne or derivatives thereof, bicyclo[6.1.0]non-2-yne, or bicyclo[6.1.0]non-3-yne). These cycloalkynes can be substituted with any of the R groups described herein.

The attachment of the silane or silane derivative forms a pre-treated (e.g., silanized) cured, patterned resin 14', which includes silanized depressions and silanized interstitial regions.

In other examples, the cured, patterned resin 14' may not be exposed to silanization. Rather, the cured, patterned resin 14' may be exposed to plasma ashing, and then the polymeric hydrogel 18 may be directly spin coated (or otherwise deposited) on the plasma ashed cured, patterned resin 14'. In this example, plasma ashing may generate surface-activating agent(s) (e.g., hydroxyl(C—OH or Si—OH) and/or carboxyl groups) that can adhere the polymeric hydrogel 18 to the cured, patterned resin 14'. In these examples, the polymeric hydrogel 18 is selected so that it reacts with the surface groups generated by plasma ashing.

In still other examples, the cured, patterned resin 14' may include unreacted epoxy groups; and thus may not be exposed to silanization because the unreacted epoxy groups can react directly with amino functional groups of the polymeric hydrogel 18. In this example, plasma ashing may be performed, e.g., if it is desirable to clean the surface of potential contaminants.

The polymeric hydrogel 18 may then be applied to the pre-treated cured, patterned resin 14' (as shown between FIG. 2C and FIG. 2D). The polymeric hydrogel 18 may be a semi-rigid polymeric material that is permeable to liquids and gases and that is tethered to the cured, patterned resin 14'.

An example of the polymeric hydrogel 18 includes an acrylamide copolymer, such as poly(N-(5-azidoacetamidylpentyl) acrylamide-co-acrylamide, PAZAM. PAZAM and some other forms of the acrylamide copolymer are represented by the following structure (I):

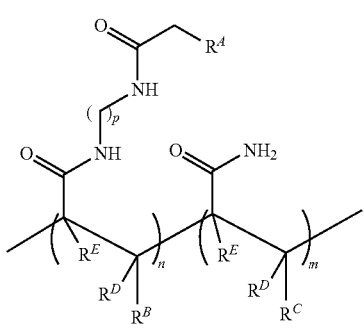

wherein:
R$^A$ is selected from the group consisting of azido, optionally substituted amino, optionally substituted alkenyl, optionally substituted alkyne, halogen, optionally substituted hydrazone, optionally substituted hydrazine, carboxyl, hydroxy, optionally substituted tetrazole, optionally substituted tetrazine, nitrile oxide, nitrone, sulfate, and thiol;

R$^B$ is H or optionally substituted alkyl; R$^C$, R$^D$, and R$^E$ are each independently selected from the group consisting of H and optionally substituted alkyl;

each of the —(CH$_2$)$_p$— can be optionally substituted;

p is an integer in the range of 1 to 50;

n is an integer in the range of 1 to 50,000; and m is an integer in the range of 1 to 100,000.

It is noted that the arrangement of the recurring "n" and "m" features in structure (I) are representative, and the monomeric subunits may be present in any order in the polymer structure (e.g., random, block, patterned, or a combination thereof).

The molecular weight of PAZAM and other forms of the acrylamide copolymer may range from about 5 kDa to about 1500 kDa or from about 10 kDa to about 1000 kDa, or may be, in a specific example, about 312 kDa.

In some examples, PAZAM and other forms of the acrylamide copolymer are linear polymers. In some other examples, PAZAM and other forms of the acrylamide copolymer are a lightly cross-linked polymers.

In other examples, the polymeric hydrogel 18 may be a variation of the structure (I). In one example, the acrylamide unit may be replaced with N,N-dimethylacrylamide

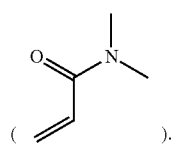

In this example, the acrylamide unit in structure (I) may be replaced with

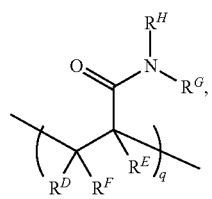

where R$^D$, R$^E$, and R$^F$ are each H or a C$_1$-C$_6$ alkyl, and R$^G$ and R$^H$ are each a C1-C6 alkyl(instead of H as is the case with the acrylamide). In this example, q may be an integer in the range of 1 to 100,000. In another example, the N,N-dimethylacrylamide may be used in addition to the acrylamide unit. In this example, structure (I) may include

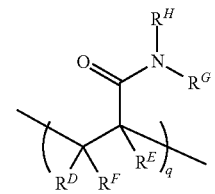

in addition to the recurring "n" and "m" features, where RD, RE, and RF are each H or a C1-C6 alkyl, and R$^G$ and R$^H$ are each a C$_1$-C$_6$ alkyl. In this example, q may be an integer in the range of 1 to 100,000.

As another example of the polymeric hydrogel 18, the recurring "n" feature in structure (I) may be replaced with a monomer including a heterocyclic azido group having structure (II):

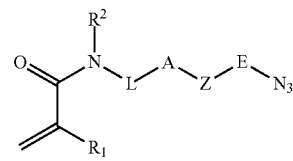

wherein R$_1$ is H or a C1-C6 alkyl; R$_2$ is H or a C1-C6 alkyl; L is a linker including a linear chain with 2 to 20 atoms selected from the group consisting of carbon, oxygen, and nitrogen and 10 optional substituents on the carbon and any nitrogen atoms in the chain; E is a linear chain including 1 to 4 atoms selected from the group consisting of carbon, oxygen and nitrogen, and optional substituents on the carbon and any nitrogen atoms in the chain; A is an N substituted amide with an H or a C1-C4 alkyl attached to the N; and Z is a nitrogen containing heterocycle. Examples of Z include 5 to 10 ring members present as a single cyclic structure or a fused structure. Some specific examples of Z include pyrrolidinyl, pyridinyl, or pyrimidinyl.

As still another example, the polymeric hydrogel 18 may include a recurring unit of each of structure (III) and (IV):

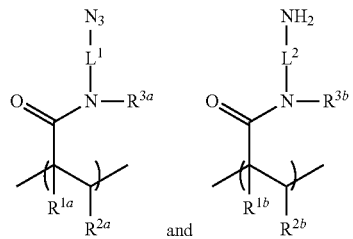

wherein each of R$^{1a}$, R$^{2a}$, R$^{1b}$ and R$^{2b}$ is independently selected from hydrogen, an optionally substituted alkyl or optionally substituted phenyl; each of R$^{3a}$ and R$^{3b}$ is independently selected from hydrogen, an optionally substituted alkyl, an optionally substituted phenyl, or an optionally substituted C7-C14 aralkyl; and each $L^1$ and $L^2$ is independently selected from an optionally substituted alkylene linker or an optionally substituted heteroalkylene linker.

It is to be understood that other molecules may be used to form the polymeric hydrogel 18, as long as they are functionalized to graft oligonucleotide primers 24 thereto. Other examples of suitable polymer layers include those having a colloidal structure, such as agarose; or a polymer mesh structure, such as gelatin; or a cross-linked polymer structure, such as polyacrylamide polymers and copolymers, silane free acrylamide (SFA), or an azidolyzed version of SFA. Examples of suitable polyacrylamide polymers may be synthesized from acrylamide and an acrylic acid or an acrylic acid containing a vinyl group, or from monomers that form [2+2] photo-cycloaddition reactions. Still other examples of suitable polymeric hydrogels 42 include mixed copolymers of acrylamides and acrylates. A variety of polymer architectures containing acrylic monomers (e.g., acrylamides, acrylates etc.) may be utilized in the examples disclosed herein, such as branched polymers, including star polymers, star-shaped or star-block polymers, dendrimers, and the like. For example, the monomers (e.g., acrylamide, acrylamide containing the catalyst, etc.) may be incorporated, either randomly or in block, into the branches (arms) of a star-shaped polymer.

The polymeric hydrogel 18 may be deposited on the surface of the pre-treated cured, patterned resin 14' using spin coating, or dipping or dip coating, or flow of the functionalized molecule under positive or negative pressure, or another suitable technique. The polymeric hydrogel 18 may be present in a mixture. In an example, the mixture includes PAZAM in water or in an ethanol and water mixture.

After being coated, the polymeric hydrogel 18 may also be exposed to a curing process to form a coating of the polymeric hydrogel 18 across the entire patterned substrate (i.e., in depression(s) 16 and on interstitial region(s) 22). In an example, curing the polymeric hydrogel 18 may take place at a temperature ranging from room temperature (e.g., about 25° C.) to about 95° C. for a time ranging from about 1 millisecond to about several days. In another example, the time may range from 10 seconds to at least 24 hours. In still another example, the time may range from about 5 minutes to about 2 hours.

The attachment of the polymeric hydrogel 18 to the pre-treated depressions and interstitial regions may be through covalent bonding. The covalent linking of the polymeric hydrogel 18 to the silanized or plasma ashed depressions is helpful for maintaining the polymeric hydrogel 18 in the depressions 16 throughout the lifetime of the ultimately formed flow cell during a variety of uses. The following are some examples of reactions that can take place between the silane or silane derivative and the polymer coating 18.

When the silane or silane derivative includes norbornene or a norbornene derivative as the unsaturated moiety, the norbornene or a norbornene derivative can: i) undergo a 1,3-dipolar cycloaddition reaction with an azide/azido group of PAZAM; ii) undergo a coupling reaction with a tetrazine group attached to PAZAM; undergo a cycloaddition reaction with a hydrazone group attached to PAZAM; undergo a photo-click reaction with a tetrazole group attached to PAZAM; or undergo a cycloaddition with a nitrile oxide group attached to PAZAM.

When the silane or silane derivative includes cyclooctyne or a cyclooctyne derivative as the unsaturated moiety, the cyclooctyne or cyclooctyne derivative can: i) undergo a strain-promoted azide-alkyne 1,3-cycloaddition (SPAAC) reaction with an azide/azido of PAZAM, or ii) undergo a strain-promoted alkyne-nitrile oxide cycloaddition reaction with a nitrile oxide group attached to PAZAM.

When the silane or silane derivative includes a bicyclononyne as the unsaturated moiety, the bicyclononyne can undergo similar SPAAC alkyne cycloaddition with azides or nitrile oxides attached to PAZAM due to the strain in the bicyclic ring system.

To form the polymeric hydrogel 18 in the depression(s) 16 and not on the interstitial region(s) 22 of the cured, patterned resin 14', the polymeric hydrogel 18 may be polished off of the interstitial regions 22. The polishing process may be performed with a chemical slurry (including, e.g., an abrasive, a buffer, a chelating agent, a surfactant, and/or a dispersant) which can remove the polymeric hydrogel 18 from the interstitial regions 22 without deleteriously affecting the underlying cured, patterned resin 14' and/or substrate 12 at those regions. Alternatively, polishing may be performed with a solution that does not include the abrasive particles. The chemical slurry may be used in a chemical mechanical polishing system. In this example, polishing head(s)/pad(s) or other polishing tool(s) is/are capable of polishing the polymeric hydrogel 18 from the interstitial regions 22 while leaving the polymeric hydrogel 18 in the depressions 16 and leaving the underlying cured, patterned resin 14' at least substantially intact. As an example, the polishing head may be a Strasbaugh ViPRR II polishing head. In another example, polishing may be performed with a polishing pad and a solution without any abrasive. For example, the polish pad may be utilized with a solution free of the abrasive particle (e.g., a solution that does not include abrasive particles).

FIG. 2D depicts the flow cell precursor 10 after the polymeric hydrogel 18 has been applied to the depressions 16. The flow cell precursor 10 may be exposed to a cleaning process. This process may utilize a water bath and sonication. The water bath may be maintained at a relatively low temperature ranging from about 22° C. to about 30° C. The silanized, coated, and polished patterned substrate may also be spin dried, or dried via another suitable technique.

As shown between FIGS. 2D and 2E, a grafting process is performed in order to graft primer(s) 24 (e.g., two different primers 24, 24' shown in FIG. 2F) to the polymeric hydrogel 18 in the depression(s) 16. The primers 24, 24' may be any forward amplification primer and/or reverse amplification primer. In this example, the primers 24, 24' are two different primers.

It is desirable for the primers 24, 24' to be immobilized to the polymeric hydrogel 18. In some examples, immobilization may be by single point covalent attachment to the polymeric hydrogel 18 at the 5' end of the respective primers 24, 24'. Any suitable covalent attachment means known in the art may be used. In some examples, immobilization may be by strong non-covalent attachment.

Examples of terminated primers that may be used include an alkyne terminated primer, a tetrazine terminated primer, an azido terminated primer, an amino terminated primer, an epoxy or glycidyl terminated primer, a thiophosphate terminated primer, a thiol terminated primer, an aldehyde terminated primer, a hydrazine terminated primer, a phosphoramidite terminated primer, a triazolinedione terminated primer, and a biotin-terminated primer. In some specific examples, a succinimidyl (NHS) ester terminated primer may be reacted with an amine at a surface of the polymeric hydrogel 18, an aldehyde terminated primer may be reacted with a hydrazine at a surface of the polymeric hydrogel 18, or an alkyne terminated primer may be reacted with an azide at a surface of the polymeric hydrogel 18, or an azide terminated primer may be reacted with an alkyne or DBCO (dibenzocyclooctyne) at a surface of the polymeric hydrogel 18, or an amino terminated primer may be reacted with an activated carboxylate group or NHS ester at a surface of the polymeric hydrogel 18, or a thiol terminated primer may be reacted with an alkylating reactant (e.g., iodoacetamine or maleimide) at a surface of the polymeric hydrogel 18, a phosphoramidite terminated primer may be reacted with a thioether at a surface of the polymeric hydrogel 18, or a biotin-modified primer may be reacted with streptavidin at a surface of the polymeric hydrogel 18.

Each of the primers 24, 24' has a universal sequence for capture and/or amplification purposes. Examples of the primers 24, 24' include P5 and P7 primers, examples of which are used on the surface of commercial flow cells sold by Illumina Inc. for sequencing, for example, on HISEQ™, HISEQX™, MISEQ™, MISEQDX™, MINISEQ™, NEXTSEQ™, NEXTSEQDX™, NOVASEQ™, ISEQ™, GENOME ANALYZER™, and other instrument platforms.

For sequential paired end sequencing, each of these primers 24, 24' may also include a cleavage site. The cleavage sites of the primers 24, 24' may be different from each other so that cleavage of the primers 24, 24' does not take place at the same time. Examples of suitable cleavage sites include enzymatically cleavable nucleobases or chemically cleavable nucleobases, modified nucleobases, or linkers (e.g., between nucleobases). The enzymatically cleavable nucleobase may be susceptible to cleavage by reaction with a glycosylase and an endonuclease, or with an exonuclease. One specific example of the cleavable nucleobase is deoxyuracil (dU), which can be targeted by the USER enzyme. In an example, the uracil base may be incorporated at the 7th base position from 3' end of the P5 primer (P5U) or of the P7 primer (P7U). Other abasic sites may also be used. Examples of the chemically cleavable nucleobases, modified nucleobases, or linkers include 8-oxoguanine, a vicinal diol, a disulfide, a silane, an azobenzene, a photocleavable group, allyl T (a thymine nucleotide analog having an allyl functionality), allyl ethers, or an azido functional ether.

In an example, grafting may be accomplished by flow through deposition (e.g., using a temporarily bound lid), dunk coating, spray coating, puddle dispensing, or by another suitable method that will attach the primer(s) 24, 24' to the polymeric hydrogel 18. Each of these example techniques may utilize a primer solution or mixture, which may include the primer(s) 24, 24', water, a buffer, and a catalyst.

Dunk coating may involve submerging the flow cell precursor 10 (shown in FIG. 2D) into a series of temperature controlled baths. The baths may also be flow controlled and/or covered with a nitrogen blanket. The baths may include the primer solution or mixture. Throughout the various baths, the primer(s) 24, 24' will attach to the primer-grafting functional group(s) of the polymeric hydrogel 18 in at least some of the depression(s) 16. In an example, the flow cell precursor 10 will be introduced into a first bath including the primer solution or mixture where a reaction takes place to attach the primer(s) 24, 24', and then moved to additional baths for washing. Movement from bath to bath may involve a robotic arm or may be performed manually. A drying system may also be used in dunk coating.

Spray coating may be accomplished by spraying the primer solution or mixture directly onto the flow cell precursor 10. The spray coated wafer may be incubated for a time ranging from about 4 minutes to about 60 minutes at a temperature ranging from about 0° C. to about 70° C. After incubation, the primer solution or mixture may be diluted and removed using, for example, a spin coater.

Puddle dispensing may be performed according to a pool and spin off method, and thus may be accomplished with a spin coater. The primer solution or mixture may be applied (manually or via an automated process) to the flow cell precursor 10. The applied primer solution or mixture may be applied to or spread across the entire surface of the flow cell precursor 10. The primer coated flow cell precursor 10 may be incubated for a time ranging from about 2 minutes to about 60 minutes at a temperature ranging from about 0° C. to about 80° C. After incubation, the primer solution or mixture may be diluted and removed using, for example, the spin coater.

In other example, the primers 24, 24' may be pre-grafted to the polymeric hydrogel 18, and thus may be present in the depressions 16 once the polymeric hydrogel 18 is applied.

FIG. 2E and FIG. 2F illustrate an example of the flow cell 10' after primer grafting.

The examples shown in FIGS. 2E and 2F are examples of the flow cell 10' without a lid or other flow cell 10' bonded thereto. In an example, the lid may be bonded to at least a portion of the cured, patterned resin 14', e.g., at some of the interstitial regions 22. The bond that is formed between the lid and the cured, patterned resin 14' may be a chemical bond, or a mechanical bond (e.g., using a fastener, etc.).

The lid may be any material that is transparent to an excitation light that is directed toward the substrate 12 and the cured, patterned resin 14'. As examples, the lid may be glass (e.g., borosilicate, fused silica, etc.), plastic, or the like. A commercially available example of a suitable borosilicate glass is D 263®, available from Schott North America, Inc. Commercially available examples of suitable plastic materials, namely cyclo olefin polymers, are the ZEONOR® products available from Zeon Chemicals L.P.

The lid may be bonded to the cured, patterned resin 14' using any suitable technique, such as laser bonding, diffusion bonding, anodic bonding, eutectic bonding, plasma activation bonding, glass frit bonding, or others methods known in the art. In an example, a spacer layer may be used to bond the lid to the cured, patterned resin 14'. The spacer layer may be any material that will seal at least some of the cured, patterned resin 14' and the lid together. In some examples, the spacer layer can be a radiation-absorbing material that aids in bonding of the cured, patterned resin 14' and the lid.

In other examples, two of the flow cells 10' may be bonded together so that the depressions 16 face a flow channel formed therebetween. The flow cells 10' may be bonded at interstitial regions 22 using similar techniques and materials described herein for bonding the lid.

Methods for Using the Flow Cell

The flow cells 10' disclosed herein may be used in a variety of sequencing approaches or technologies, including techniques often referred to as sequencing-by-synthesis (SBS), cyclic-array sequencing, sequencing-by-ligation, pyrosequencing, and so forth. With any of these techniques, since the polymeric hydrogel 18 and attached primer(s) 24, 24' are present in the depressions 16 and not on the interstitial regions 22, amplification will be confined to the depressions.

As one example, a sequencing by synthesis (SBS) reaction may be run on a system such as the HISEQ™, HISEQX™, MISEQ™, MISEQDX™, MINISEQ™, NOVASEQ™, ISEQ™, NEXTSEQDX™, or NEXTSEQ™ sequencer systems from Illumina (San Diego, CA). In SBS, extension of a nucleic acid primer (e.g., a sequencing primer) along a nucleic acid template (i.e., the sequencing template) is monitored to determine the sequence of nucleotides in the template. The underlying chemical process can be polymerization (e.g., catalyzed by a polymerase enzyme) or ligation (e.g., catalyzed by a ligase enzyme). In a particular polymerase-based SBS process, fluorescently labeled nucleotides are added to the sequencing primer (thereby extending the sequencing primer) in a template dependent fashion such that detection of the order and type of nucleotides added to the sequencing primer can be used to determine the sequence of the template.

Prior to sequencing, the capture and amplification primers 24, 24' can be exposed to a sequencing library, which is amplified using any suitable method, such as cluster generation.

In one example of cluster generation, the library fragments are copied from the hybridized primers 24, 24' by 3' extension using a high-fidelity DNA polymerase. The original library fragments are denatured, leaving the copies immobilized. Isothermal bridge amplification may be used to amplify the immobilized copies. For example, the copied templates loop over to hybridize to an adjacent, complementary primer 24, 24' and a polymerase copies the copied templates to form double stranded bridges, which are denatured to form two single stranded strands. These two strands loop over and hybridize to adjacent, complementary primers 24, 24' and are extended again to form two new double stranded loops. The process is repeated on each template copy by cycles of isothermal denaturation and amplification to create dense clonal clusters. Each cluster of double stranded bridges is denatured. In an example, the reverse strand is removed by specific base cleavage, leaving forward template polynucleotide strands. Clustering results in the formation of several template polynucleotide strands in each of the depressions 16. This example of clustering is bridge amplification, and is one example of the amplification that may be performed. It is to be understood that other amplification techniques may be used, such as the exclusion amplification (Examp) workflow (Illumina Inc.).

A sequencing primer may be introduced that hybridizes to a complementary sequence on the template polynucleotide strand. This sequencing primer renders the template polynucleotide strand ready for sequencing. The 3'-ends of the templates and any flow cell-bound primers 24, 24' (not attached to the copy) may be blocked to prevent interference with the sequencing reaction, and in particular, to prevent undesirable priming.

To initiate sequencing, an incorporation mix may be added to the flow cell 10'. In one example, the incorporation mix includes a liquid carrier, a polymerase, and fluorescently labeled nucleotides. The fluorescently labeled nucleotides may include a 3' OH blocking group. When the incorporation mix is introduced into the flow cell 10', the fluid enters a flow channel and flows into the depressions 16 (where the template polynucleotide strands are present).

The fluorescently labeled nucleotides are added to the sequencing primer (thereby extending the sequencing primer) in a template dependent fashion such that detection of the order and type of nucleotides added to the sequencing primer can be used to determine the sequence of the template. More particularly, one of the nucleotides is incorporated, by a respective polymerase, into a nascent strand that extends the sequencing primer and that is complementary to the template polynucleotide strand. In other words, in at least some of the template polynucleotide strands across the flow cell 10', respective polymerases extend the hybridized sequencing primer by one of the nucleotides in the incorporation mix.

The incorporation of the nucleotides can be detected through an imaging event. During an imaging event, an illumination system (not shown) may provide an excitation light to the flow cell 10' surface(s).

In some examples, the nucleotides can further include a reversible termination property (e.g., 3' OH blocking group) that terminates further primer extension once a nucleotide has been added to the sequencing primer. For example, a nucleotide analog having a reversible terminator moiety can be added to the sequencing primer such that subsequent extension cannot occur until a deblocking agent is delivered to remove the moiety. Thus, for examples that use reversible termination, a deblocking reagent can be delivered to the flow cell 10' after detection occurs.

Wash(es) may take place between the various fluid delivery steps. The SBS cycle can then be repeated n times to extend the sequencing primer by n nucleotides, thereby detecting a sequence of length n.

In some examples, the forward strands may be sequenced and removed, and then reverse strands are constructed and sequenced as described herein.

While SBS has been described in detail, it is to be understood that the flow cells 10' described herein may be utilized with other sequencing protocol, for genotyping, or in other chemical and/or biological applications.

While the examples described in FIG. 1 and FIG. 2A through FIG. 2F illustrate the use of the example resin compositions in the formation of a flow cell 10', it is to be understood that the resin compositions disclosed herein may be used in other applications where low autofluorescence is desired. As one example, the resin composition 14, 14' may be used in any optically-based SBS technique. As other examples, the resin composition 14, 14' may be used in planar waveguides, in complementary metal-oxide semiconductors (CMOS), etc.

To further illustrate the present disclosure, examples are given herein. It is to be understood that these examples are provided for illustrative purposes and are not to be construed as limiting the scope of the present disclosure.

NON-LIMITING WORKING EXAMPLES

Example 1

The comparative and example resin compositions of this example included an epoxy resin matrix of glycidyl polyhedral oligomeric silsesquioxane and epoxycyclohexyl polyhedral oligomeric silsesquioxane monomers.

Two of the comparative resin compositions (1 and 2) were prepared with a photoacid generator having a small anion (namely, OMNICAT® PAG 270 (triphenylsulfonium hexafluorophosphate)), and two other of the comparative resin compositions (3 and 4) were prepared with a photoacid generator having a large anion (namely, IRGACURE® PAG 290 (triphenylsulfonium tetrakis(perfluorophenyl) borate)). One example resin composition (5) was prepared with a combination of OMNICAT® PAG 270 and IRGACURE® PAG 290.

The resin compositions are provided in Table 1 below.

TABLE 1

| SAMPLE | Epoxy resin matrix (mass %) | PAG having a small anion (mass %) | PAG having a large anion (mass %) |
|---|---|---|---|
| Comp. Ex. 1 | 98.75 | 1.25 | — |
| Comp. Ex. 2 | 97.5 | 2.5 | — |
| Comp. Ex. 3 | 98.75 | — | 1.25 |
| Comp. Ex. 4 | 97.5 | — | 2.5 |
| Ex. 5 | 97.5 | 1.25 | 1.25 |

Each of the comparative and example resins was incorporated (e.g., about 18% by mass) into a solvent mixture of PGMEA and DMSO. The resin/solvent mixtures were spread out and several hand imprints were made in each of the resins. The imprinted resin compositions were cured (using 365 nm UV light) using different exposure times, including 1 second, 3 seconds, 5 seconds, 7.5 seconds, 15 seconds, and/or 30 seconds.

Figure 3:
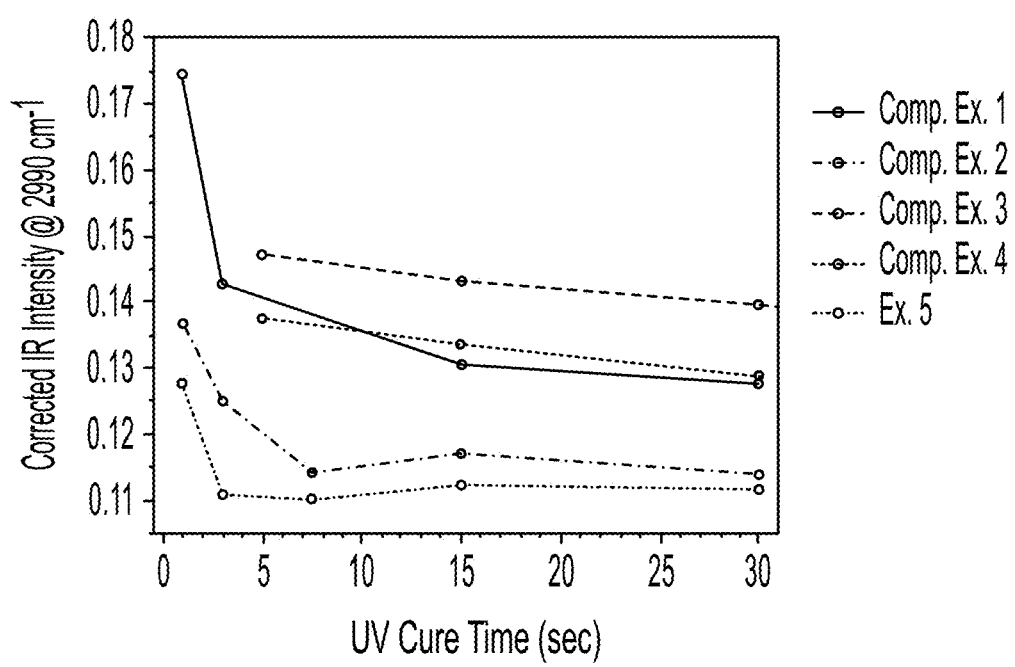
FIG. 3 is a graph depicting the corrected infrared (IR) intensity at 2990 cm$^{-1}$ (Y axis) versus ultraviolet (UV) cure time (in seconds, X axis) for four comparative example resins, and one example resin including a combination of photoacid generators as disclosed herein.

The cured imprinted resins were analyzed using Fourier-transform infrared spectroscopy (FTIR), and the results are shown in FIG. 3. The Y-axis represents the corrected intensity at 2990 cm$^{-1}$. A correlation exists between the intensity at this wavelength with the hardness of the resin, and thus the extent of cure of the epoxy monomers. A lower corrected intensity at 2990 cm$^{-1}$ corresponds to a higher extent of cure. As shown in FIG. 3, the corrected intensity at 2990 cm$^{-1}$ for Ex. 5 was less than each of Comp. Ex. 1, 2, 3, and 4, at similar cure times. At 3 seconds of cure time, Ex. 5 had a corrected intensity at 2990 cm$^{-1}$ of about 0.11, whereas Comp. Ex. 1 and Comp. Ex. 2 had corrected intensities at 2990 cm$^{-1}$ of about 0.142 and about 0.125, respectively. At 5 seconds of cure time, Comp. Ex. 3 and Comp. Ex. 4 had corrected intensities at 2990 cm$^{-1}$ of about 0.146 and about 0.136, respectively. These results indicate that the example resin composition (Ex. 5) having the combination of photoacid generators had the highest extent of cure (i.e., lowest corrected intensity at 2990 cm$^{-1}$) and the quickest extent of cure, compared to the comparative resins which had either the photoacid generator with the small anion or the photoacid generator with the large anion.

Example 2

The comparative and example resin compositions of this example included an epoxy resin matrix of glycidyl polyhedral oligomeric silsesquioxane and epoxycyclohexyl polyhedral oligomeric silsesquioxane monomers.

The comparative resin (6) included a photoinitiator (PI) (namely, 2,2-Dimethoxy-2-phenylacetophenone) and a photoacid generator (namely Bis-4-methylphenyl) iodonium hexafluorophosphate). The example resin (7) included the same epoxy resin matrix, but with an example of the photoacid combination disclosed herein instead of the PI/PAG combination. The photoacid combination in the example resin 7 included a photoacid generator having a small anion (namely, Bis-(4-methylphenyl) iodonium hexafluorophosphate) and a photoacid generator having a large anion (namely, IRGACURE® PAG 290).

The resin compositions are provided in Table 2 below.

TABLE 2

| SAMPLE | Epoxy resin matrix (mass %) | PAG having a small anion (mass %) | PAG having a large anion (mass %) | PI (mass %) |
|---|---|---|---|---|
| Comp. Ex. 6 | 95.5 | 2.5 | — | 2.0 |
| Ex. 7 | 95 | 4.0 | 1.0 | — |

Each of the comparative and example resins was incorporated (e.g., about 18% by mass) into a solvent mixture of PGMEA and DMSO. The resin/solvent mixtures were imprinted using a HERCULES® tool from EVG. The imprinted resin compositions were cured using different doses (J) of incident UV light at 365 nm. The doses for Ex. resin 7 ranged from 1 J to 10 J, while the doses for Comp. Ex. 6 ranges from 5 J to 60 J.

Figure 4:
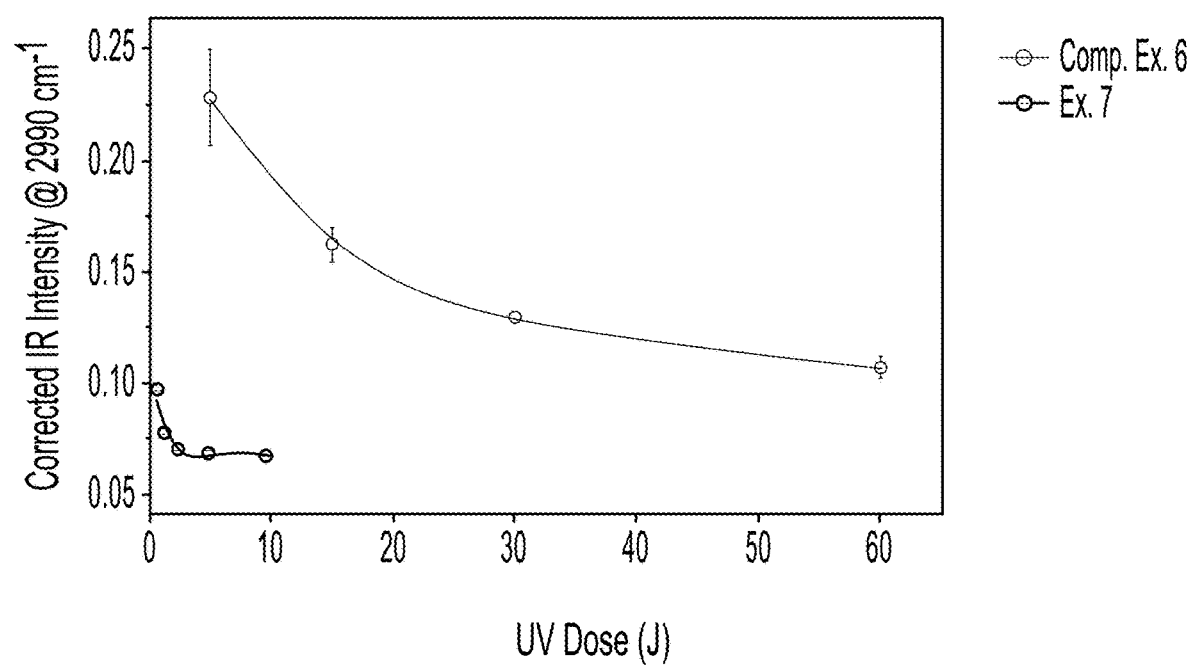
FIG. 4 is a graph depicting the corrected IR intensity at 2990 cm 1 (Y axis) versus the UV light dose (in Joules, X axis) for a comparative example resin, and one example resin including a combination of photoacid generators as disclosed herein.

The cured imprinted resins were analyzed using FTIR, and the results are shown in FIG. 4. The Y-axis represents the corrected intensity at 2990 cm$^{-1}$. As shown in FIG. 4, the corrected intensities at 2990 cm$^{-1}$ for Ex. 7 at each of the UV doses between 1 J (~3.33 seconds on the tool used) and 10 J (~33.3 seconds on the tool used) were less than the corrected intensities at 2990 cm$^{-1}$ for Comp. Ex. 6 at each of the UV doses between 5 J (~16.65 seconds on the tool used) and 60 J (~199.8 seconds on the tool used). At all of the UV doses, Ex. 7 had a corrected intensity at 2990 cm$^{-1}$ of about 0.10 or less, whereas Comp. Ex. 6 had corrected intensities at 2990 cm$^{-1}$ ranging from 0.225 to about 0.12. These results indicate that the example resin composition (Ex. 7) having the combination of photoacid generators reached a higher extent of cure with more than an order of magnitude reduction in UV dose when compared to a resin including a PI/PAG package.

Figure 5:
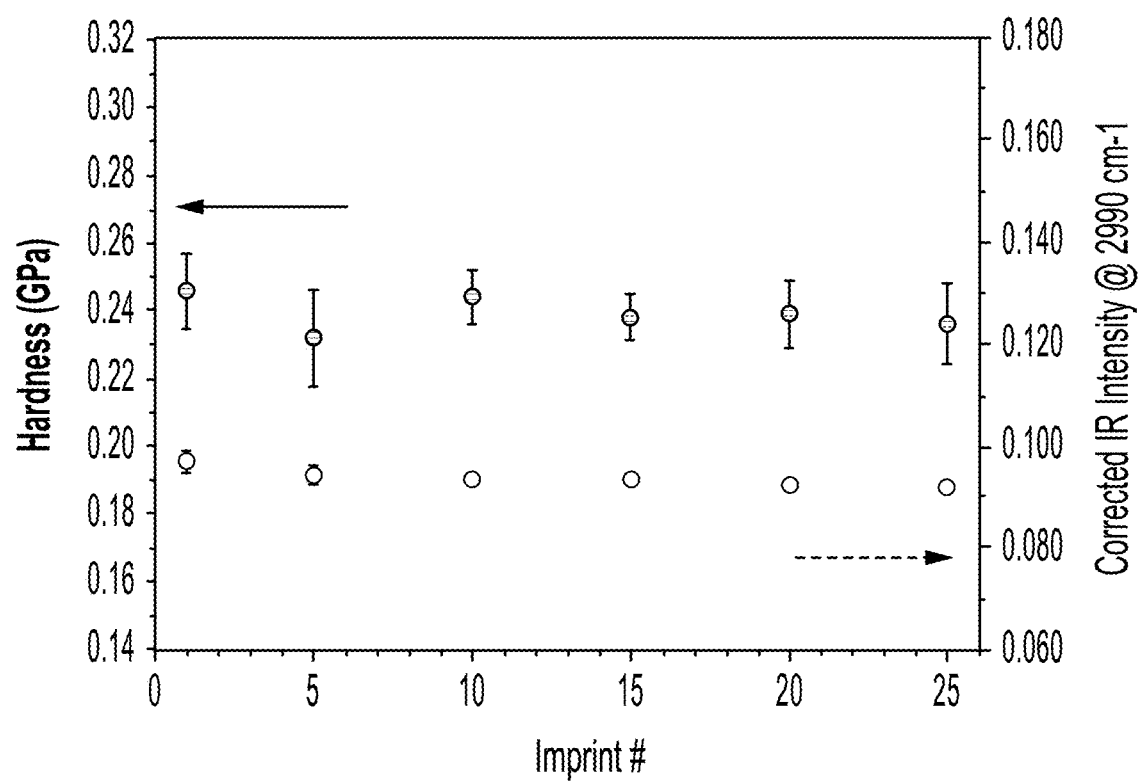
FIG. 5 is a graph depicting the hardness (in GPa, left Y axis) and the corrected IR intensity at 2990 cm$^{-1}$ (right Y axis) for several different imprints (imprint #, X axis) prepared with an example of the resin disclosed herein.

The resin mixture including Ex. 7 resin was also deposited on 25 different glass wafers, and was imprinted using a master template. While the master template was held in place, the resin was cured with a 0.9 J dose (3 second cure time). For imprints 1, 5, 10, 15, and 20, the extent of cure was assessed with hardness measurements and FTIR. The results are shown in FIG. 5. These results indicate that both hardness values (consistently between 0.23 GPa and 0.25 GPa) and the corrected IR intensity at 2990 cm-1 (consistently between 0.090 and 0.100) are stable for the different imprints.

Quality measurements for depression depth, side wall angle, top diameter, etc. were also taken. The results are not reproduced herein, but were within the expected values for the master template that was used. The quality measurements indicate that the example resin can be patterned with high quality, fine features.

Example 3

The example resin compositions of this example included an epoxy resin matrix of glycidyl polyhedral oligomeric silsesquioxane and epoxycyclohexyl polyhedral oligomeric silsesquioxane monomers.

The example resins (8A-8C, 9A-9C, and 10A-10C) included the same epoxy resin matrix, and varying amounts of the photoacid generator having a small anion (namely, Bis-(4-methylphenyl) iodonium hexafluorophosphate) and a photoacid generator having a large anion (namely, IRGACURE® PAG 290). The resin compositions are provided in Table 3 below.

TABLE 3

| SAMPLE | Epoxy resin matrix (mass %) | PAG having a small anion (mass %) | PAG having a large anion (mass %) |
| --- | --- | --- | --- |
| Ex. 8A | 97.5 | 2 | 0.5 |
| Ex. 8B | 95.5 | 4 | 0.5 |
| Ex. 8C | 94.5 | 5 | 0.5 |
| Ex. 9A | 97 | 2 | 1 |
| Ex. 9B | 95 | 4 | 1 |
| Ex. 9C | 94 | 5 | 1 |
| Ex. 10A | 96.5 | 2 | 1.5 |
| Ex. 10B | 94.5 | 4 | 1.5 |
| Ex. 10C | 93.5 | 5 | 1.5 |

Each of the example resins was incorporated (e.g., about 18% by mass) into a solvent mixture of PGMEA and DMSO. The resin/solvent mixtures were imprinted using a HERCULES® tool from EVG. The imprinted resin compositions were cured (using incident UV light at 365 nm) using different exposure times, including 2 seconds, 4 seconds, 8 seconds, and 16 seconds.

Figure 6:
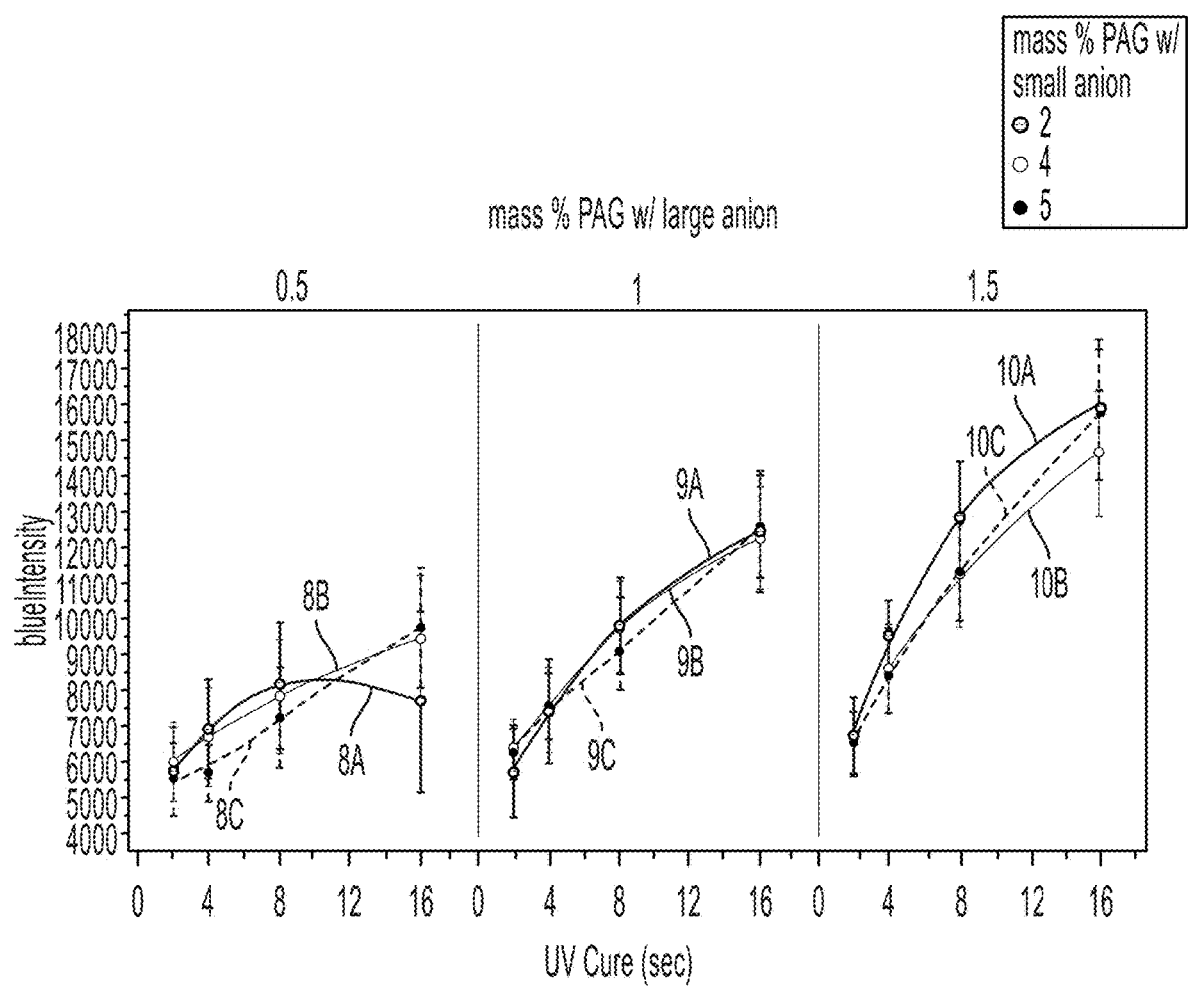
FIG. 6 is a graph depicting the autofluorescence (blue intensity, Y axis) versus UV cure time (in seconds, X axis) for nine example resins including different combinations of photoacid generators as disclosed herein.

The autofluorescence (AF) was measured for each of the cured imprinted resins. The results are shown in FIG. 6. The Y-axis represents the blue fluorescence intensity (in arbitrary units, au). As shown in FIG. 6, the blue fluorescence intensity increased with increased cure times, regardless of the resin composition. The blue intensity for Ex. 8A, Ex. 8B, and Ex. 8C (each with 0.5 mass % of the photoacid generator with the large anion) were below 10,000 at all of the cure times, indicating that small amounts of the photoacid generator with the large anion do not deleteriously affect the autofluorescence. When the mass % of the photoacid generator with the large anion was increased to 1 (Ex. 9A, Ex. 9B, and Ex. 9C), the blue increased above 10,000 at the longest cure time (16 seconds) regardless of the amount of the photoacid generator with the small anion. This indicates that resin compositions with a higher amount of the photoacid generator may perform better in terms of lower autofluorescence with lower curing times. When the mass % of the photoacid generator with the large anion was increased to 1.5 (Ex. 10A, Ex. 10B, and Ex. 10C), the blue increased above 10,000 at the longer cure times (8 seconds and 16 seconds) regardless of the amount of the photoacid generator with the small anion. This also indicates that resin compositions with a higher amount of the photoacid generator may perform better in terms of lower autofluorescence with lower curing times.

Figure 7:
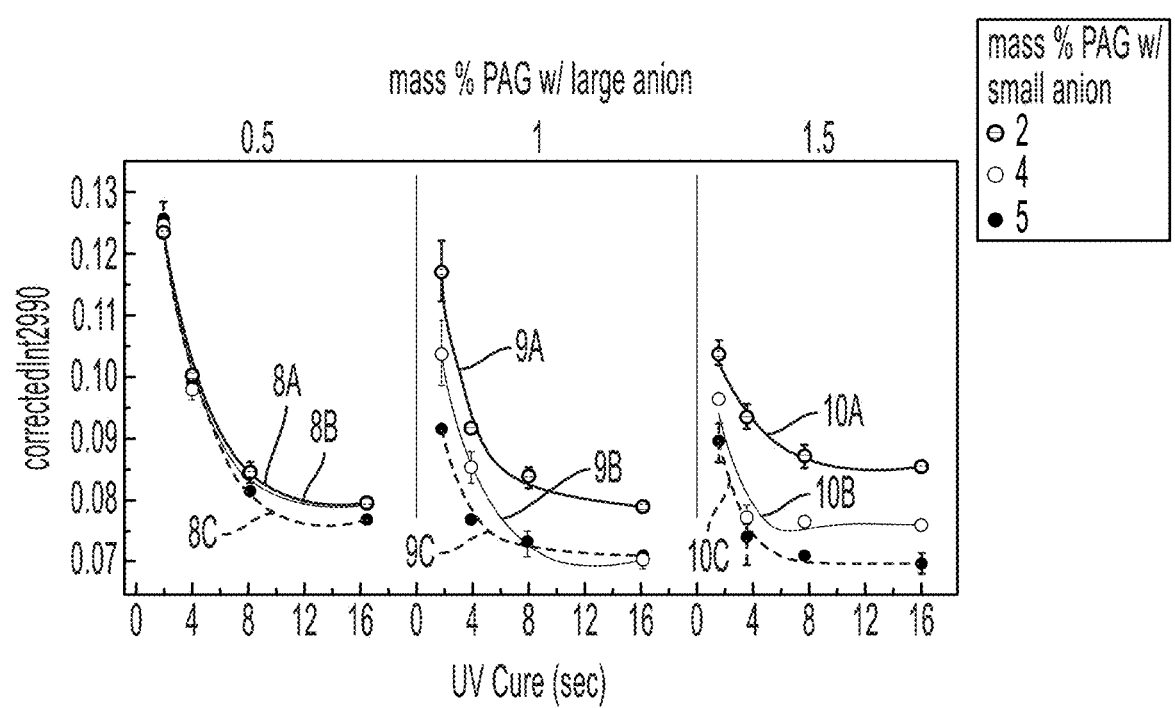
FIG. 7 is a graph depicting the corrected infrared (IR) intensity at 2990 cm$^{-1}$ (Y axis) versus UV cure time (in seconds, X axis) for nine example resins including different combinations of photoacid generators as disclosed herein.

These cured imprinted resins were also analyzed using FTIR, and the results are shown in FIG. 7. The Y-axis represents the corrected intensity at 2990 cm$^{-1}$. As shown in FIG. 7, the corrected intensity at 2990 cm$^{-1}$ for Ex. 8A, Ex. 8B, and Ex. 8C (each with 0.5 mass % of the photoacid generator with the large anion) were very similar at the respective cure times (e.g., ~0.125 at 2 seconds, ~0.10 at 4 seconds, between 0.08 and 0.085 at 8 seconds, and ~0.08 at 16 seconds). At the 2 and 4 second cure times, the higher amounts of photoacid generator with the large anion seemed to lower the corrected intensity at 2990 cm$^{-1}$, regardless of the amount of photoacid generator with the small anion. More specifically, at the 2 and 4 second cure times, each of Ex. 9A, Ex. 9B, Ex. 9C, Ex. 10A, Ex. 10B, and Ex. 10C had a lower corrected intensity at 2990 cm$^{-1}$ than each of Ex. 8A, Ex. 8B, and Ex. 8C. At the 8 and 16 second cure times, however, higher amounts of photoacid generator with the large anion were more effective when paired with higher amounts of the photoacid generator with the small anion, than when paired with the lower amount of the photoacid generator with the small anion. More specifically, at the 8 and 16 second cure times, each of Ex. 9B, Ex. 9C, Ex. 10B, and Ex. 10C had a lower corrected intensity at 2990 cm$^{-1}$ than Ex. 9A and Ex. 10A.

The corrected intensity at 2990 cm$^{-1}$ for each of the example resins in FIG. 7 is also lower than each of each of the comparative resins in FIG. 3 (from Example 1) at the same cure time. These results illustrate the synergistic effect of different examples of the photoacid generator combination disclosed herein, as compared to either of the photoacid generators used on their own.

Additional Notes

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

While several examples have been described in detail, it is to be understood that the disclosed examples may be modified. Therefore, the foregoing description is to be considered non-limiting.

What is claimed is:

1. A resin composition, comprising:
an epoxy resin matrix;
a first photoacid generator including an anion having a molecular weight less than 250 g/mol; and
a second photoacid generator including an anion having a molecular weight greater than about 300 g/mol;
wherein i) a cation of the first photoacid generator has, or ii) a cation of the second photoacid generator has, or iii) the cations of the first and second photoacid generators have a mass attenuation coefficient of at least 0.1 L/(g*cm) at a wavelength of incident light to cure the resin composition;
and wherein the epoxy resin matrix comprises an epoxy material selected from the group consisting of an epoxy functionalized silsesquioxane; trimethylolpropane triglycidyl ether; tetrakis(epoxycyclohexyl ethyl)tetramethyl cyclotetrasiloxane; a copolymer of (epoxycyclohexylethyl)methylsiloxane and dimethylsiloxane; 1,3-bis[2-(3,4-epoxycyclohexyl) ethyl]tetramethyl disiloxane; 1,3-bis(glycidoxypropyl) tetramethyl disiloxane; 3,4-epoxycyclohexylmethyl-3,4-epoxycyclohexanecarboxylate; bis((3,4-epoxycyclohexyl)methyl) adipate; 4-vinyl-1-cyclohexene 1,2-epoxide; vinylcyclohexene dioxide; 4,5-epoxytetrahydrophthalic acid diglycidylester; 1,2-epoxy-3-phenoxypropane; glycidyl methacrylate; 1,2-epoxyhexadecane; poly(ethylene glycol) diglycidylether; pentaerythritol glycidyl ether; diglycidyl 1,2-cyclohexanedicarboxylate; tetrahydrophthalic acid diglycidyl ester; and combinations thereof.

2. A resin composition, comprising:
an epoxy resin matrix;
a first photoacid generator including an anion having a molecular weight less than 250 g/mol; and
a second photoacid generator including an anion having a molecular weight greater than about 300 g/mol;
wherein i) a cation of the first photoacid generator has, or ii) a cation of the second photoacid generator has, or iii) the cations of the first and second photoacid generators have a mass attenuation coefficient of at least 0.1 L/(g*cm) at a wavelength of incident light to cure the resin composition;
and wherein the first photoacid generator is selected from the group consisting of bis-(4-methylphenyl) iodonium hexafluorophosphate, triphenylsulfonium hexafluorophosphate, diaryliodonium hexafluorophosphate, and diaryliodonium hexafluoroantimonate.

3. The resin composition as defined in claim 2, wherein the epoxy resin matrix comprises an epoxy material selected from the group consisting of an epoxy functionalized silsesquioxane; trimethylolpropane triglycidyl ether; tetrakis (epoxycyclohexyl ethyl)tetramethyl cyclotetrasiloxane; a copolymer of (epoxycyclohexylethyl)methylsiloxane and dimethylsiloxane; 1,3-bis[2-(3,4-epoxycyclohexyl)ethyl]tetramethyl disiloxane; 1,3-bis(glycidoxypropyl) tetramethyl disiloxane; 3,4-epoxycyclohexylmethyl-3,4-epoxycyclohexanecarboxylate; bis((3,4-epoxycyclohexyl)methyl) adipate; 4-vinyl-1-cyclohexene 1,2-epoxide; vinylcyclohexene dioxide; 4,5-epoxytetrahydrophthalic acid diglycidylester; 1,2-epoxy-3-phenoxypropane; glycidyl methacrylate; 1,2-epoxyhexadecane; poly(ethylene glycol) diglycidylether; pentaerythritol glycidyl ether; diglycidyl 1,2-cyclohexanedicarboxylate; tetrahydrophthalic acid diglycidyl ester; and combinations thereof.

4. The resin composition as defined in claim 1, wherein the second photoacid generator is selected from the group consisting of triphenylsulfonium tetrakis(perfluorophenyl) borate, tetrakis(pentafluorophenyl) gallate, and tris[(trifluoromethyl) sulfonyl]methanide.

5. The resin composition as defined in claim 1, wherein the cation of the first photoacid generator is, or the cation of the second photoacid generator is, or the cations of the first and second photoacid generators are selected from the group consisting of a diaryliodonium cation having a maximum absorption wavelength ($\lambda_{max}$) of about 350 nm and a triphenylsulfonium cation.

6. The resin composition as defined in claim 1, wherein:
the cation of the second photoacid generator has the mass attenuation coefficient of at least 0.1 L/(g*cm) at the wavelength of incident light to cure the resin composition; and
the cation of the first photoacid generator has a mass attenuation coefficient less than 0.1 L/(g*cm) at the wavelength of incident light to cure the resin composition.

7. The resin composition as defined in claim 6, wherein:
the cation of the second photoacid generator is selected from the group consisting of a diaryliodonium cation having a maximum absorption wavelength ($\lambda_{max}$) of about 350 nm and a triphenylsulfonium cation; and
the cation of the first photoacid generator is selected from the group consisting of a bis-(4-methylphenyl) iodonium cation, a (cumene)cyclopentadienyliron (II) cation, a ferrocene cation, a 1-naphthyl diphenyl sulfonium cation, a (4-phenylthiophenyl) diphenylsulfonium, a bis(2,4,6-trimethylphenyl) iodonium cation, a bis(4-tert-butylphenyl) iodonium cation, a N-hydroxy-5-norbornene-2,3-dicarboximide perfluoro-1-butanesulfonate cation, and a triarylsulfonium cation.

8. The resin composition as defined in claim 1, wherein the cation of the first photoacid generator and the cation of the second photoacid generator have respective mass attenuation coefficients of at least 0.1 L/(g*cm) at the wavelength of incident light to cure the resin composition.

9. The resin composition as defined in claim 1, wherein:
the first photoacid generator is present in an amount ranging from about 1 mass % to about 5 mass % of total solids in the resin composition; and
the second photoacid generator is present in an amount ranging from about 0.1 mass % to about 2 mass % of total solids in the resin composition.

10. The resin composition as defined in claim 1, wherein the molecular weight of the anion of the second photoacid generator ranges from greater than about 300 g/mol to about 1,000 g/mol.

11. A resin composition, comprising:
an epoxy resin matrix including an epoxy functionalized polyhedral oligomeric silsesquioxane;
a first photoacid generator including an anion having a molecular weight less than about 250 g/mol; and
a second photoacid generator including an anion having a molecular weight ranging from about 300 g/mol to about 1,000 g/mol;
wherein i) a cation of the first photoacid generator has, or ii) a cation of the second photoacid generator has, or iii) the cations of the first and second photoacid generators have a mass attenuation coefficient of at least 0.1 L/(g*cm) at the wavelength of incident light to cure the resin composition.

12. The resin composition as defined in claim 11, wherein the epoxy functionalized polyhedral oligomeric silsesquioxane is selected from the group consisting of a glycidyl functionalized polyhedral oligomeric silsesquioxane, an epoxycyclohexyl ethyl functionalized polyhedral oligomeric silsesquioxane, and combinations thereof.

13. The resin composition as defined in claim 11, wherein the epoxy resin matrix further includes an additional epoxy material selected from the group consisting of trimethylolpropane triglycidyl ether; tetrakis(epoxycyclohexyl ethyl) tetramethyl cyclotetrasiloxane; a copolymer of (epoxycyclohexylethyl)methylsiloxane and dimethylsiloxane; 1,3-bis[2-(3,4-epoxycyclohexyl)ethyl]tetramethyl disiloxane; 1,3-bis(glycidoxypropyl) tetramethyl disiloxane; 3,4-epoxycyclohexylmethyl-3,4-epoxycyclohexanecarboxylate; bis((3,4-epoxycyclohexyl)methyl) adipate; 4-vinyl-1-cyclohexene 1,2-epoxide; vinylcyclohexene dioxide; 4,5-epoxytetrahydrophthalic acid diglycidylester; 1,2-epoxy-3-phenoxypropane; glycidyl methacrylate; 1,2-epoxyhexadecane; poly(ethylene glycol) diglycidylether; pentaerythritol glycidyl ether; diglycidyl 1,2-cyclohexanedicarboxylate; tetrahydrophthalic acid diglycidyl ester; and combinations thereof.

14. The resin composition as defined in claim 11, wherein the first photoacid generator is present in an amount ranging from about 1 mass % to about 5 mass % of total solids in the resin composition.

15. The resin composition as defined in claim 11, wherein the second photoacid generator is present in an amount ranging from about 0.1 mass % to about 2 mass % of total solids in the resin composition.

16. The resin composition as defined in claim 11, wherein the first photoacid generator is selected from the group consisting of bis-(4-methylphenyl) iodonium hexafluorophosphate, triphenylsulfonium hexafluorophosphate, diaryliodonium hexafluorophosphate, and diaryliodonium hexafluoroantimonate.

17. The resin composition as defined in claim 11, wherein the second photoacid generator is selected from the group consisting of triphenylsulfonium tetrakis(perfluorophenyl) borate, tetrakis(pentafluorophenyl) gallate, and tris[(trifluoromethyl) sulfonyl]methanide.

18. The resin composition as defined in claim 11, wherein the cation of the first photoacid generator is, or the cation of the second photoacid generator is, or both the cations of the first and second photoacid generators are selected from the group consisting of a diaryliodonium cation having a maximum absorption wavelength ($\lambda_{max}$) of about 350 nm and a triphenylsulfonium cation.

19. The resin composition as defined in claim 11, wherein:
the cation of the second photoacid generator has the mass attenuation coefficient of at least 0.1 L/(g*cm) at the wavelength of incident light to cure the resin composition; and
the cation of the first photoacid generator has a mass attenuation coefficient less than 0.1 L/(g*cm) at the wavelength of incident light to cure the resin composition.

20. The resin composition as defined in claim 19, wherein:
the cation of the second photoacid generator is selected from the group consisting of a diaryliodonium cation having a maximum absorption wavelength ($\lambda_{max}$) of about 350 nm and a triphenylsulfonium cation; and
the cation of the first photoacid generator is selected from the group consisting of a bis-(4-methylphenyl) iodonium cation, a (cumene)cyclopentadienyliron (II) cation, a ferrocene cation, a 1-naphthyl diphenyl sulfonium cation, a (4-phenylthiophenyl) diphenylsulfonium, a bis(2,4,6-trimethylphenyl) iodonium cation, a bis(4-tert-butylphenyl) iodonium cation, a N-hydroxy-5-norbornene-2,3-dicarboximide perfluoro-1-butanesulfonate cation, and a triarylsulfonium cation.

21. The resin composition as defined in claim 11, wherein the cation of the first photoacid generator and the cation of the second photoacid generator have respective mass attenuation coefficients of at least 0.1 L/(g*cm) at the wavelength of incident light to cure the resin composition.

22. A flow cell, comprising:
a substrate; and
a cured, patterned resin on the substrate, the cured, patterned resin including depressions separated by interstitial regions, and the cured, patterned resin including a cured form of a resin composition including:
an epoxy resin matrix;
a first photoacid generator including an anion having a molecular weight less than about 250 g/mol; and
a second photoacid generator including an anion having a molecular weight greater than about 300 g/mol;
wherein i) a cation of the first photoacid generator has, or ii) a cation of the second photoacid generator has, or iii) the cations of the first and second photoacid generators have a mass attenuation coefficient of at least 0.1 L/(g*cm) at a wavelength of incident light to cure the resin composition.

23. The flow cell as defined in claim 22, further comprising:
a hydrogel in the depressions; and
amplification primers attached to the hydrogel.

24. The flow cell as defined in claim 22, wherein the epoxy resin matrix comprises an epoxy material selected from the group consisting of an epoxy functionalized silsesquioxane; trimethylolpropane triglycidyl ether; tetrakis (epoxycyclohexyl ethyl)tetramethyl cyclotetrasiloxane; a copolymer of (epoxycyclohexylethyl)methylsiloxane and dimethylsiloxane; 1,3-bis[2-(3,4-epoxycyclohexyl)ethyl]tetramethyl disiloxane; 1,3-bis(glycidoxypropyl) tetramethyl disiloxane; 3,4-epoxycyclohexylmethyl-3,4-epoxycyclohexanecarboxylate; bis((3,4-epoxycyclohexyl)methyl) adipate; 4-vinyl-1-cyclohexene 1,2-epoxide; vinylcyclohexene dioxide; 4,5-epoxytetrahydrophthalic acid diglycidylester; 1,2-epoxy-3-phenoxypropane; glycidyl methacrylate; 1,2-epoxyhexadecane; poly(ethylene glycol) diglycidylether; pentaerythritol glycidyl ether; diglycidyl 1,2-cyclohexanedicarboxylate; tetrahydrophthalic acid diglycidyl ester; and combinations thereof.

25. The flow cell as defined in claim 22, wherein:
the first photoacid generator is selected from the group consisting of bis-(4-methylphenyl) iodonium hexafluorophosphate, triphenylsulfonium hexafluorophosphate, diaryliodonium hexafluorophosphate, and diaryliodonium hexafluoroantimonate; and
the second photoacid generator is selected from the group consisting of triphenylsulfonium tetrakis(perfluorophenyl) borate, tetrakis(pentafluorophenyl) gallate, and tris [(trifluoromethyl) sulfonyl]methanide.

26. A method of making a flow cell, comprising:
depositing a resin composition on a substrate, the resin composition including:
an epoxy resin matrix;
a first photoacid generator including an anion having a molecular weight less than about 250 g/mol; and
a second photoacid generator including an anion having a molecular weight greater than about 300 g/mol;
wherein i) a cation of the first photoacid generator has, or ii) a cation of the second photoacid generator has, or iii) the cations of the first and second photoacid generators have a mass attenuation coefficient of at least 0.1 L/(g*cm) at a wavelength of incident light to cure the resin composition;
nanoimprinting the deposited resin composition using a working stamp; and
exposing the nanoimprinted, deposited resin composition to the incident light at an energy dose ranging from about 0.5 J to about 10 J for 30 seconds or less to form a cured, patterned resin.

27. A resin composition, comprising:
an epoxy resin matrix;
a first photoacid generator including a first anion having a first molecular weight; and
a second photoacid generator including a second anion having a second molecular weight that is at least 50 g/mol greater than the first molecular weight;
wherein i) a cation of the first photoacid generator has, or ii) a cation of the second photoacid generator has, or iii) the cations of the first and second photoacid generators have a mass attenuation coefficient of at least 0.1 L/(g*cm) at the wavelength of incident light to cure the resin composition;
and wherein the epoxy resin matrix comprises an epoxy material selected from the group consisting of an epoxy functionalized silsesquioxane; trimethylolpropane triglycidyl ether; tetrakis(epoxycyclohexyl ethyl)tetramethyl cyclotetrasiloxane; a copolymer of (epoxycyclohexylethyl)methylsiloxane and dimethylsiloxane; 1,3-bis[2-(3,4-epoxycyclohexyl) ethyl]tetramethyl disiloxane; 1,3-bis(glycidoxypropyl) tetramethyl disiloxane; 3,4-epoxycyclohexylmethyl-3,4-epoxycyclohexanecarboxylate; bis((3,4-epoxycyclohexyl)methyl) adipate; 4-vinyl-1-cyclohexene 1,2-epoxide; vinylcyclohexene dioxide; 4,5-epoxytetrahydrophthalic acid diglycidylester; 1,2-epoxy-3-phenoxypropane; glycidyl methacrylate; 1,2-epoxyhexadecane; poly(ethylene glycol) diglycidylether; pentaerythritol glycidyl ether; diglycidyl 1,2-cyclohexanedicarboxylate; tetrahydrophthalic acid diglycidyl ester; and combinations thereof.

28. The resin composition as defined in claim 3, wherein the second photoacid generator is selected from the group consisting of triphenylsulfonium tetrakis(perfluorophenyl) borate, tetrakis(pentafluorophenyl) gallate, and tris[(trifluoromethyl) sulfonyl]methanide.

* * * * *